United States Patent
Ha et al.

(10) Patent No.: US 9,166,626 B2
(45) Date of Patent: Oct. 20, 2015

(54) ENCODING, DECODING, AND MULTI-STAGE DECODING CIRCUITS FOR CONCATENATED BCH, AND ERROR CORRECTION CIRCUIT OF FLASH MEMORY DEVICE USING THE SAME

(71) Applicant: Korea Advanced Institute of Science and Technology, Daejeon (KR)

(72) Inventors: Jeong Seok Ha, Daejeon (KR); Sung Gun Cho, Seoul (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 305 days.

(21) Appl. No.: 13/678,812

(22) Filed: Nov. 16, 2012

(65) Prior Publication Data

US 2013/0132793 A1    May 23, 2013

(30) Foreign Application Priority Data

| Nov. 18, 2011 | (KR) | .................... | 10-2011-0120623 |
| Jul. 5, 2012 | (KR) | .................... | 10-2012-0073370 |
| Jul. 5, 2012 | (KR) | .................... | 10-2012-0073371 |
| Jul. 5, 2012 | (KR) | .................... | 10-2012-0073372 |
| Jul. 5, 2012 | (KR) | .................... | 10-2012-0073373 |

(51) Int. Cl.
*H03M 13/29* (2006.01)
*H03M 13/37* (2006.01)
*H03M 13/15* (2006.01)

(52) U.S. Cl.
CPC ...... *H03M 13/2912* (2013.01); *H03M 13/2918* (2013.01); *H03M 13/2927* (2013.01); *H03M 13/3707* (2013.01); *H03M 13/152* (2013.01)

(58) Field of Classification Search
CPC .................................................. H03M 13/19
USPC ......................................... 714/755, 762, 786
See application file for complete search history.

(56) References Cited

U.S. PATENT DOCUMENTS

| 5,920,578 | A | 7/1999 | Zook | |
| 6,307,901 | B1 | 10/2001 | Yu | |
| 8,120,960 | B2* | 2/2012 | Varkony | ................... 365/185.16 |
| 8,276,051 | B2 | 9/2012 | Weingarten | |
| 8,341,502 | B2 | 12/2012 | Steiner | |
| 8,453,022 | B2 | 5/2013 | Katz | |
| 8,467,249 | B2 | 6/2013 | Katz | |
| 8,468,431 | B2 | 6/2013 | Steiner | |
| 8,510,639 | B2 | 8/2013 | Steiner | |
| 8,621,321 | B2 | 12/2013 | Steiner | |
| 2003/0126549 | A1* | 7/2003 | Seki | ............................ 714/786 |
| 2004/0181735 | A1 | 9/2004 | Xin | |
| 2008/0256417 | A1* | 10/2008 | Andersson | .................... 714/762 |
| 2010/0131831 | A1 | 5/2010 | Weingarten | |
| 2010/0253555 | A1 | 10/2010 | Weingarten | |
| 2011/0161775 | A1 | 6/2011 | Weingarten | |

OTHER PUBLICATIONS

Kumar, S Ashok, "Design and Implementation of Low Power Turbo Decoders", S.R.M. Institute of Science and Technology, May 2005.
"Lattice Turbo Decoder User's Guides", Lattice Semiconductor Corporation, Nov. 2008.

* cited by examiner

*Primary Examiner* — Fritz Alphonse
(74) *Attorney, Agent, or Firm* — The PL Law Group, PLLC

(57) ABSTRACT

The present disclosure relates to a BCH encoding, decoding, and multi-stage decoding circuits and method, and an error correction circuit of a flash memory device using the same. The concatenated BCH multi-stage decoding circuit includes: a first stage encoding unit that receives a part or all of data input to a flash memory device, performs BCH encoding, and outputs a first output BCH code or a parity bit thereof; an interleaving unit that receives a part or all of data input to the flash memory device, interleaves, and outputs the data, and a second stage encoding unit that performs BCH encoding of the BCH code or data that is the output of the interleaving unit, and outputs a second output BCH code or a parity bit thereof.

23 Claims, 18 Drawing Sheets

ENCODING, DECODING, AND MULTI-STAGE DECODING CIRCUITS FOR CONCATENATED BCH, AND ERROR CORRECTION CIRCUIT OF FLASH MEMORY DEVICE USING THE SAME

CROSS-REFERENCE TO RELATED APPLICATION

This application claims the priorities of Korean Patent Application Nos. 10-2011-0120623 filed on November 18, 10-2012-0073370 filed on Jul. 5, 2012, 10-2012-0073371 filed on Jul. 5, 2012, 10-2012-0073372 filed on Jul. 5, 2012, and 10-2012-0073373 filed on Jul. 5, 2012, in the Korean Intellectual Property Office, the disclosures of which are incorporated herein by reference.

TECHNICAL FIELD

The present disclosure relates to a concatenated Bose-Chadhuri-Hocquenghem (BCH) encoding, decoding, and multi-stage decoding circuits and method, and an error correction circuit of a flash memory device using the same, and more particularly, to a concatenated BCH encoding, decoding, and multi-stage decoding circuit and method, and an error correction circuit of a flash memory device using the same, capable of improving error correction performance for the flash memory through the concatenated BCH encoding, adjusting a delay time according to an error degree through multi-stage decoding, achieving low power consumption, small size, and low cost, and improving error correction performance.

BACKGROUND

Recently, according to the increase of a speed of a processor and a main storage device such as a RAM used in various electronic products, a bottleneck phenomenon in which an operation processing speed of the electronic product is determined according to a speed of an auxiliary storage device has been deepened. A device storing magnetic field such as a hard disk drive (HDD), and an optical disc device (optic disc drive, ODD) such as a CD and a DVD have been mainly used as the existing auxiliary storage device. Among them, in the optical disc device, data input and output are not free, and a speed of the data output is extremely low. In addition, the device storing the magnetic field has a speed higher than that of the optical disc device, but still cause the bottleneck phenomenon, and data may be easily damaged or disappeared by impact.

Accordingly, a solid state drive (SSD) formed of a semiconductor element obtained by applying the existing MOS-FET structure is magnified.

The SSD has a work processing speed higher than that of the HDD, and it is possible to input and output data at a high speed without searching time by random access to an element in which the data is stored. In addition, mechanical delay or failure rate is significantly low, and there is an advantage that the data is not damaged by outer impact. Further, in the SSD, power consumed in the semiconductor element is low, the SSD can be driven with low heat generation, low noise, and low power without a separate mechanical device, and a product including the SSD can have a small size and a light weight as compared with the HDD.

As the SSD, generally, there are a NOR flash memory configured in a NOR type and a NAND flash memory configured in a NAND type. Between them, the NAND flash memory has a high integration degree of a circuit in a serial connection type, and is easily made to have mass capacity, and a reading/writing speed is high. In addition, due to characteristics that data storage capability is excellent and it is easily made to have mass capacity, the NAND flash memory is used in most of mass capacity SSD.

However, the NAND flash memory element is tending to be minute and multi-valued according to the use of a minute process and the increase of the number of storage bits per cell. The increase of storage density increases a side effect such as deterioration of reliability of the element and decrease of life.

A problem according to the increase of the storage density of the NAND flash memory and necessity of error correction encoding will be described with reference to FIGS. 1(a) to 1(d).

Referring to FIGS. 1(a) to 1(d), a Single-Level Cell (SLC) flash memory (FIG. 1(a)) is a NAND element that stores 1-bit information, a Multi-Level Cell (MLC) flash memory (FIG. 1(b)) is a NAND element that stores 2-bit information, a Tri-Level Cell (TLC) flash memory (FIG. 1(c)) is a NAND element that stores 3-bit information, and a Quad-Level Cell (QLC) Flash Memory (FIG. 1(d)) is a NAND element that stores 4-bit information.

Referring to FIGS. 1(a) to 1(d), probability of occurrence based on inter-level interference is increased at the reading operation time according to the increase of the number of bits stored per cell, error occurrence probability is drastically increased as the reading/writing operation is repeated, and thus a problem of decreasing reliability of the product occurs. Therefore, the error correction circuit with low power and a high process amount is an essential element in design of stable NAND flash memories with reasonable price.

To solve such a problem, generally, error correction encoding is used, and the error correction encoding needs extra bits including information for detection of errors and correction of errors. Accordingly, an extra area of cells is required to store the extra bits. However, to maximize the storage capacity of the storage medium, the area of the cells necessary to store the extra bits is miniaturized, and thus it is necessary to miniaturize the extra bits.

In addition, due to the increase of storage data errors, new error correction encoding for substituting the existing BCH encoding and Reed-Solomon (RS) encoding requiring exponential complexity and a lot of extra bits in the number of errors is necessary.

As the error correction encoding has high performance, it has high complexity and long decoding delay time. In a case of the NAND flash memory, little errors occur at the initial stage, and the number of occurring errors is increased according to the increase of the use time. When only error correction encoding with simply high performance is used, it has a long decoding delay time when there are little errors, which is not efficient.

SUMMARY

An advantage of some aspects of the present disclosure is to provide a concatenated BCH encoding, decoding, and multi-stage decoding circuit and method capable of adjusting a delay time according to an error degree through a decoding, decoding, and multi-stage decoding for a flash memory device.

In addition, another advantage is to provide a concatenated BCH encoding, decoding, and multi-stage decoding circuit and method capable of achieving a small size and a low cost by decreasing the number of decoders necessary for multi-stage decoding.

In addition, still another advantage is to provide a concatenated BCH encoding, decoding, and multi-stage decoding circuit and method capable of improving error correction performance by configuring codes in a 3-dimensional matrix form, diversifying combination of message blocks in codes, or increasing reliability of data input to a decoding circuit.

In addition, still another advantage is to provide a concatenated BCH encoding, decoding, and multi-stage decoding circuit and method capable of reducing power consumption required in a decoding operation by actively blocking power provided for a decoding-completed decoder.

In addition, still another advantage is to provide an error correction circuit of a flash memory device.

Advantages of some aspects of the present disclosure are not limited to the above description, and other advantages which are not described may be clearly understood by a person who is skilled in the art from the following description.

According to an aspect of the present disclosure, there is provided a concatenated BCH encoding circuit including: a first stage encoding unit that receives a part or all of data input to a flash memory core, performs BCH encoding, and outputs a first output BCH code or a parity bit thereof; an interleaving unit that receives a part or all of data input to the flash memory core, interleaves the data, and outputs the data; and a second stage encoding unit that performs BCH encoding of the BCH code or data that is the output of the interleaving unit, and outputs a second output BCH code or a parity bit thereof.

According to another aspect of the present disclosure, there is provided a concatenated BCH encoding circuit including: a first stage encoding unit that receives a part or all of data input to a flash memory core, performs BCH encoding, and outputs a first output BCH code or a parity bit thereof; an interleaving unit that interleaves and outputs the first output BCH code or data protected thereby; and a second stage encoding unit that performs BCH encoding of the BCH code or data that is the output of the interleaving unit and outputs a second output BCH code or a parity bit thereof.

According to still another aspect of the present disclosure, there is provided a concatenated BCH decoding circuit including: a first stage decoding unit that receives a part of a concatenated BCH code, performs BCH decoding, and outputs a first output BCH code or first output data protected thereby; a de-interleaving unit that divides the first output BCH code or the first output data into two or more blocks, de-interleaves and outputs the blocks; a second stage decoding unit that performs BCH decoding of the output of the de-interleaving unit, and outputs a second output BCH code or second output data protected thereby; and an interleaving unit that divides the second output BCH code or the second output data into two or more blocks, interleaves, and outputs the blocks to the first stage decoding unit.

The BCH concatenated decoding circuit may further include an additional decoding unit that receives decoding failure information from the first and second stage decoding units, receives the second output BCH code or the second output data protected thereby, and performs additional decoding on the decoding failure block.

In the BCH concatenated decoding circuit, when decoding failure of the concatenated BCH code occurs in a small number of error blocks, the additional decoding unit may obtain only additional information corresponding to the error blocks, may perform additional decoding, and may correct an error.

In the BCH concatenated decoding circuit, the additional information may include information about bits corresponding to a small number of error blocks, positions of which are determined.

In the BCH concatenated decoding circuit, the additional decoding unit may receive decoding failure or success of constituent codes from both of the first and second stage decoding units to perform the additional decoding, and may determine the positions of the small number of error blocks.

According to still another aspect of the present disclosure, there is provided a concatenated BCH decoding circuit including: a stage decoding unit that receives a part of storage data provided from a flash memory core at a first stage start decoding time, receives a de-interleaving result at a second stage decoding time, and receives an interleaving result at a first stage re-decoding time, performs BCH decoding, and outputs an output BCH code and output data protected thereby; a de-interleaving unit that divides the output BCH code or the output data of the stage decoding unit at a first stage decoding completion time into two or more blocks, de-interleaves, and outputs the blocks to the stage decoding unit; and an interleaving unit that divides the output BCH code or the output data of the stage decoding unit at a second stage decoding completion time into two or more blocks, interleaves, and outputs the blocks to the stage decoding unit.

In the concatenated BCH decoding circuit, the row code and the column code may have the same message length, and may be systematic codes in which a massage part and a parity part are completely divided.

According to still another aspect of the present disclosure, there is provided a concatenated BCH decoding circuit including: a plurality of stage decoding units that receive a part of storage data or an interleaving result provided from a flash memory core, and perform BCH decoding; and a plurality of interleaving units that are positioned between stage decoding units different from each other, interleave the decoding result of the stage decoding unit of the front stage for each block, convert data directivity thereof, and then provide the decoding result to the stage decoding unit of the rear stage.

In the concatenated BCH decoding circuit, the storage data provided from the flash memory core may include a plurality of codes having a 3-dimensional matrix structure, and x-axis parity information, y-axis parity information, and z-axis parity information assigned to an x-axis, a y-axis, and a z-axis of the plurality of codes, respectively.

In the concatenated BCH decoding circuit, the storage data provided from the flash memory core may include a plurality of codes having a 2-dimensional matrix structure, and a plurality of parity information assigned to the plurality of codes to have three or more kinds of directivity.

According to still another aspect of the present disclosure, there is provided a concatenated BCH decoding circuit including: a first stage decoding unit that receives a part of storage data provided from a flash memory core, and performs BCH decoding; a de-interleaving unit that divides the output of the first stage decoding unit into two or more blocks, de-interleaves, and outputs the blocks; a second stage decoding unit that performs BCH decoding of the output of the de-interleaving unit; an interleaving unit that divides the output of the second stage decoding unit into two or more blocks, interleaves, and outputs the blocks to the first stage decoding unit; and a threshold voltage control unit that receives decoding success data from the first and second stage decoding units, compares the data with the storage data, calculates statistic characteristics of a data distribution curve, adjusts a threshold voltage of the flash memory core according to the statistic characteristics of the data distribution curve, and controls the flash memory core to re-input the data to the first stage decoding unit.

In the concatenated BCH decoding circuit, the statistic characteristics may be the number of cases where "1" is stored but is stored to be determined as "0", cases where "0" is stored but is stored to be determined as "1", or cases where "0" and "1" are stored and the storage value is as it is.

In the concatenated BCH decoding circuit, the threshold voltage control unit may include: a first comparison unit that compares decoding success data of the first stage decoding unit with the storage data for each block, and acquires statistic characteristics of a data distribution curve; a de-interleaving unit that de-interleaves the storage data; a second comparison unit that compares decoding success data of the second stage decoding unit with the output data of the de-interleaving unit for each block, and acquires statistic characteristics of a data distribution curve; and a threshold voltage determining unit that includes a mapping table in which a threshold voltage adjusting standard corresponding to each of the statistic characteristics of the data distribution curve is stored, newly acquires a threshold voltage corresponding to statistic characteristics of the data distribution curve grasped by the first and second comparison units on the basis of the mapping table, and reports the threshold voltage to the flash memory core.

According to still another aspect of the present disclosure, there is provided a concatenated BCH decoding circuit including: a first stage decoding unit that receives a part of a concatenated BCH code, performs BCH decoding, and outputs a first output BCH code or first output data protected thereby; a de-interleaving unit that divides the first output BCH code or the first output data into two or more blocks, de-interleaves and outputs the blocks; a second stage decoding unit that performs BCH decoding of the output of the de-interleaving unit, and outputs a second output BCH code or second output data protected thereby; an interleaving unit that divides the second output BCH code or the second output data into two or more blocks, interleaves, and outputs the blocks to the first stage decoding unit; and a decoder power control unit that monitors an operation state of the first and second stage decoding unit, grasps a decoding success block, and temporarily shuts out power supply until a new concatenated BCH code is input with respect to the decoding success block.

In the concatenated BCH decoding circuit, the decoder power control unit may grasp a decoding success decoder using decoding failure information transmitted from each of the plurality of column decoder and the plurality of row decoder, and may temporarily shut out power supply to the decoding success decoder until a new concatenated BCH code is received.

According to still another aspect of the present disclosure, there is provided an error correction circuit of a flash memory core including: an outer encoding unit that divides input data into two or more pieces of data, performs BCH encoding, and outputs row BCH codes of the same number as that of the divided data; an interleaving unit that divides the row BCH code or data protected thereby into two or more blocks again, interleaves the blocks, and outputs the same number of blocks; an inner encoding unit that performs BCH encoding of the blocks interleaved by the interleaving unit, and outputs column BCH codes; an interleaving unit that divides the row BCH code or data protected thereby into two or more blocks again, interleaves the blocks, and outputs the same number of blocks; a first stage decoding unit that receives a part of storage data provided from a flash memory core, performs BCH decoding, and outputs a first output BCH code or first output data protected thereby; a de-interleaving unit that divides the first output BCH code or the first output data into two or more blocks, de-interleaves, and outputs the blocks; a second stage decoding unit that performs BCH decoding of the output of the de-interleaving unit, and outputs a second BCH code or second output data protected thereby; and an interleaving unit that divides the second output BCH code or the second output data into two or more blocks, interleaves, and outputs the blocks to the first stage decoding unit.

According to still another aspect of the present disclosure, there is provided an error correction circuit of a flash memory core including: an outer encoding unit that divides input data into two or more piece of data, performs BCH encoding, outputs the same number of row BCH codes as that of the divided data; an interleaving unit that divides the row BCH code or data protected thereby into two or more blocks again, interleaves the blocks, and outputs the same number of blocks; an inner encoding unit that performs BCH encoding of the blocks interleaved by the interleaving unit, and outputs column BCH codes; stage decoding unit that receives a part of storage data provided from a flash memory core at a first stage start decoding time, receives a de-interleaving result at a second stage decoding time, and receives an interleaving result at a first stage re-decoding time, performs BCH decoding, and outputs an output BCH code and output data protected thereby; a de-interleaving unit that divides the output BCH code or the output data of the stage decoding unit at a first stage decoding completion time into two or more blocks, de-interleaves, and outputs the blocks to the stage decoding unit; and an interleaving unit that divides the output BCH code or the output data of the stage decoding unit at a second stage decoding completion time into two or more blocks, interleaves, and outputs the blocks to the stage decoding unit.

According to still another aspect of the present disclosure, there is provided an error correction circuit of a flash memory core including: an outer encoding unit that divides input data into two or more pieces of data, performs BCH encoding, and outputs row BCH codes of the same number as that of the divided data; an interleaving unit that divides the row BCH code or data protected thereby into two or more blocks again, interleaves the blocks, and outputs the same number of blocks; an inner encoding unit that performs BCH encoding of the blocks interleaved by the interleaving unit, and outputs column BCH codes; a plurality of stage decoding units that receive a part of storage data or an interleaving result provided from a flash memory core, and perform BCH decoding; and a plurality of interleaving units that are positioned between stage decoding units different from each other, interleave the decoding result of the stage decoding unit of the front stage for each block, convert data directivity thereof, and then provide the decoding result to the stage decoding unit of the rear stage.

According to still another aspect of the present disclosure, there is provided an error correction circuit of a flash memory core including: an outer encoding unit that divides input data into two or more piece of data, performs BCH encoding, and outputs the same number of row BCH codes as that of the divided data; an interleaving unit that divides the row BCH code or data protected thereby into two or more blocks again, interleaves the blocks, and outputs the same number of blocks; an inner encoding unit that performs BCH encoding of the blocks interleaved by the interleaving unit, and outputs column BCH codes; a first stage decoding unit that receives a part of storage data provided from a flash memory core, and performs BCH decoding; a de-interleaving unit that divides the output of the first stage decoding unit into two or more blocks, de-interleaves, and outputs the blocks; a second stage decoding unit that performs BCH decoding of the output of the de-interleaving unit; an interleaving unit that divides the output of the second stage decoding unit into two or more blocks, interleaves, and outputs the blocks to the first stage decoding unit; and threshold voltage control unit that receives decoding success data from the first and second stage decoding units, compares the data with the storage data, calculates statistic characteristics of a data distribution curve, adjusts a threshold voltage of the flash memory core according to the statistic characteristics of the data distribution curve, and controls the flash memory core to re-input the data to the first stage decoding unit.

According to still another aspect of the present disclosure, there is provided an error correction circuit of a flash memory core including: an outer encoding unit that divides input data into two or more pieces of data, performs BCH encoding, and outputs row BCH codes of the same number as that of the divided data; an interleaving unit that divides the row BCH code or data protected thereby into two or more blocks again, interleaves the blocks, and outputs the same number of blocks; an inner encoding unit that performs BCH encoding of the blocks interleaved by the interleaving unit, and outputs column BCH codes; a first stage decoding unit that receives a part of storage data provided from a flash memory core, performs BCH decoding, and outputs a first output BCH code or first output data protected thereby; a de-interleaving unit that divides the first output BCH code or the first output data into two or more blocks, de-interleaves, and outputs the blocks; a second stage decoding unit that performs BCH decoding of the output of the de-interleaving unit, and outputs a second output BCH code or second output data protected thereby; an interleaving unit that divides the second output BCH code or the second output data into two or more blocks, interleaves, and outputs the blocks to the first stage decoding unit; and a decoder power control unit that monitors an operation state of the first and second stage decoding unit, grasps a decoding success block, and temporarily shuts out power supply until a new concatenated BCH code is input with respect to the decoding success block.

According to the present disclosure, the BCH codes are the outer and inner codes, the outer code is interleaved for each block and encoded to the inner code, the encoded storage data is decoded to multi-stages according to an error degree and is decoded only for any one of the outer code or the inner code, decoding of the inner code and the outer code are repeatedly performed until the error is completely corrected or cannot be corrected any more, or additional information is obtained and decoding is performed when an error for each block occurs. Accordingly, it is possible to improve error correction performance and to adoptively reduce a decoding delay time. In addition, when there is a little error and the error is corrected by decoding of the outer code or the inner code, access to data with a small size that is a part of the entire data is easy.

The number of all decoders is reduced by 50% through one state decoding unit capable of performing both of the row decoding operation and the column decoding operation, and thus an effect of reducing a size of a chip having a function of error correction encoding and a chip producing cost is provided.

In addition, the codes are configured in the 3-dimensional matrix form or combination of message blocks in the codes is diversified, the number of dimensions of the decoding operation is increased, the error is corrected using more parity blocks with respect to the codes, and thus it is possible to improve the error correction performance.

Further, the threshold voltage of the memory device is adjusted through the concatenated BCH multi-stage decoding circuit, the concatenated BCH multi-stage decoding circuit receives reliably data from the memory device, and thus the error correction performance of the concatenated BCH multi-stage decoding circuit is maximized.

Furthermore, the power supply to the decoding success decoders is temporarily blocked at the decoding operation time, the decoding success decoders are excluded from the repeated decoding operations, the average number of decoders used for the multi-stage decoding operation is reduced, and thus power consumption of the entire concatenated BCH decoding circuit is reduced.

BRIEF DESCRIPTION OF THE DRAWINGS

The above and other objects, features and advantages of the present disclosure will become apparent from the following description of certain exemplary embodiments given in conjunction with the accompanying drawings, in which.

DETAILED DESCRIPTION OF EMBODIMENTS

Figure 1:
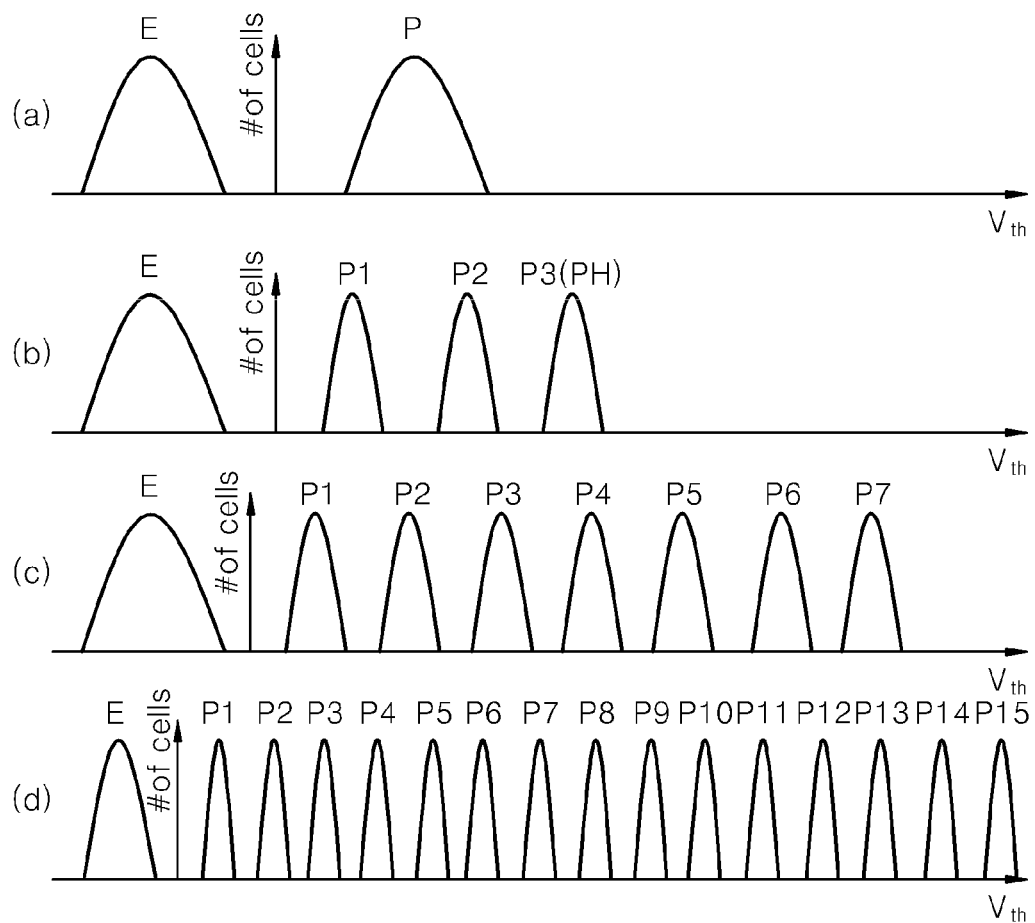
FIGS. 1(a) to 1(d) are diagrams illustrating distribution of threshold voltage in Single Level Cell (SLC), Multi Level Cell (MLC), Tri-Level Cell (TLC), and Quad Level Cell (QLC) flash memories, respectively.

Hereinafter, embodiments of the present disclosure will be described with reference to the accompanying drawings for a person skilled in the art to easily embody the embodiments. However, the present disclosure may be embodied in various aspects, and is not limited to the embodiments described herein. In the drawings, a part having no relation with description is omitted to clearly describe the present disclosure, and similar reference numerals and signs are given to similar parts in the whole specification, and will be described.

Generally, a flash memory device has a die connected in parallel as a basic structure, and the die is configured by memory blocks that are a once-erasable unit. Each memory block is configured by a page that is a reading/writing unit. Accordingly, it is preferable that the error correction encoding may be performed by the page unit that is the reading/writing unit. The units of pages are different for each manufacturing companies, but generally, 1 KB page is used in an SLC element, 4 KB or 8 KB page is frequently used in an MLC element.

The flash memory device requires high reliability as a storage device, and thus has to be operated in a very low error rate area when the error correction encoding is applied. In addition, for a high reading and writing speed, a delay time and complexity of encoding and decoders is restricted. In addition, an extra space other than data is restricted for efficiency of a storage space, and thus a ratio of a parity bit is restricted in comparison with the entire storage data. Accordingly, a method in which there is no error floor or it is possible to solve the error floor although there is the error floor, while encoding suitable for the flash memory device has a high encoding ratio (for example, equal to or more than 0.9), has to be proposed on the basis of a sufficient short delay time and low complexity.

The concatenated BCH codes used in the present disclosure are configured block-wise. When the concatenated BCH codes are not used block-wise but used by a bit unit to raise the error correction performance than the existing BCH codes, the concatenated BCH codes are configured by a plurality of BCH constituent codes with a short length. The constituent codes with the short length have very low error correction performance (1 bit or 2 bit correction) due to a high code rate required in the flash memory device. Accordingly, in a flash memory device capable of making only hard decision, constituent codes which fails in correction easily occur in the bit unit concatenated BCH encoding, and thus the bit unit concatenated BCH encoding has low performance. In this case, when additional information is used, it is possible to improve performance. However, the additional information is necessary for every decoding, and thus there is a problem of high complexity and a relatively long delay time.

The block-wise concatenated BCH code used in the present disclosure has characteristics suitable for the flash memory device. The block-wise concatenated BCH code is configured by a small number of long BCH constituent codes. The long constituent code has error correction performance sufficient even in the high code rate required in the flash memory device. For example, referring to FIG. 7, it can be known that it is formed of constituent codes capable of correcting each of 10-bit and 14-bit errors. Accordingly, even in the flash memory device capable of making only hard decision, constituent codes which fails in correction occurs at low probability in the block-wise concatenated BCH code, and thus the flash memory device has higher performance than that of the bit unit concatenated BCH codes.

Figure 7:
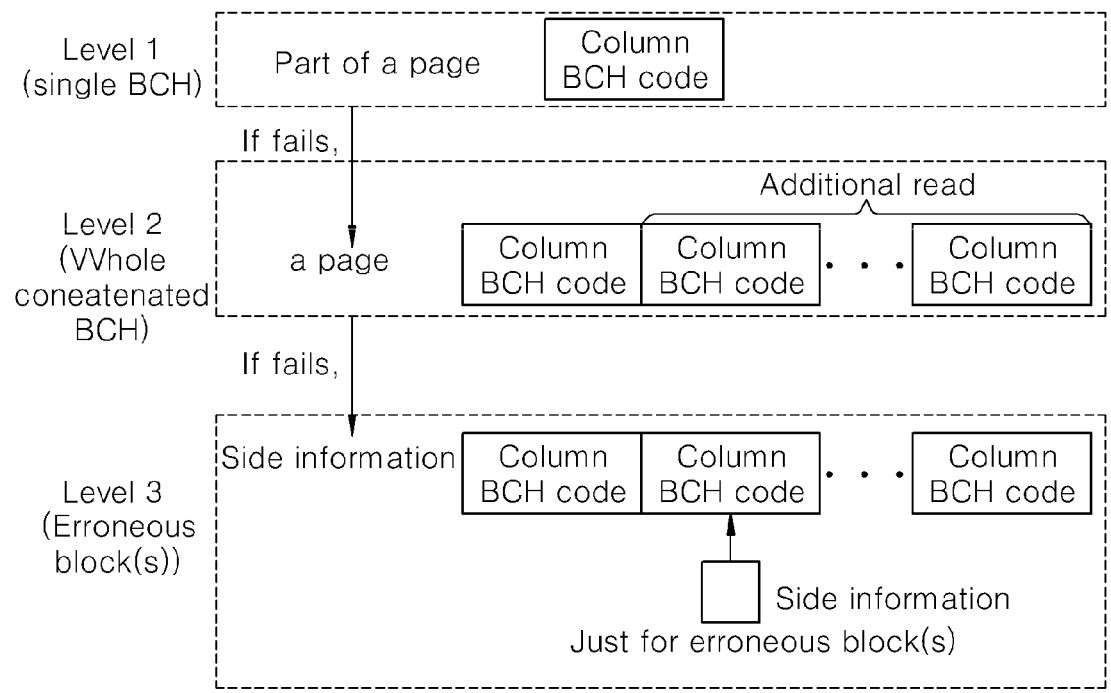
FIG. 7 is a diagram illustrating a concatenated BCH multi-stage decoding method of a flash memory according to a first embodiment of the present disclosure.
Figure 8:
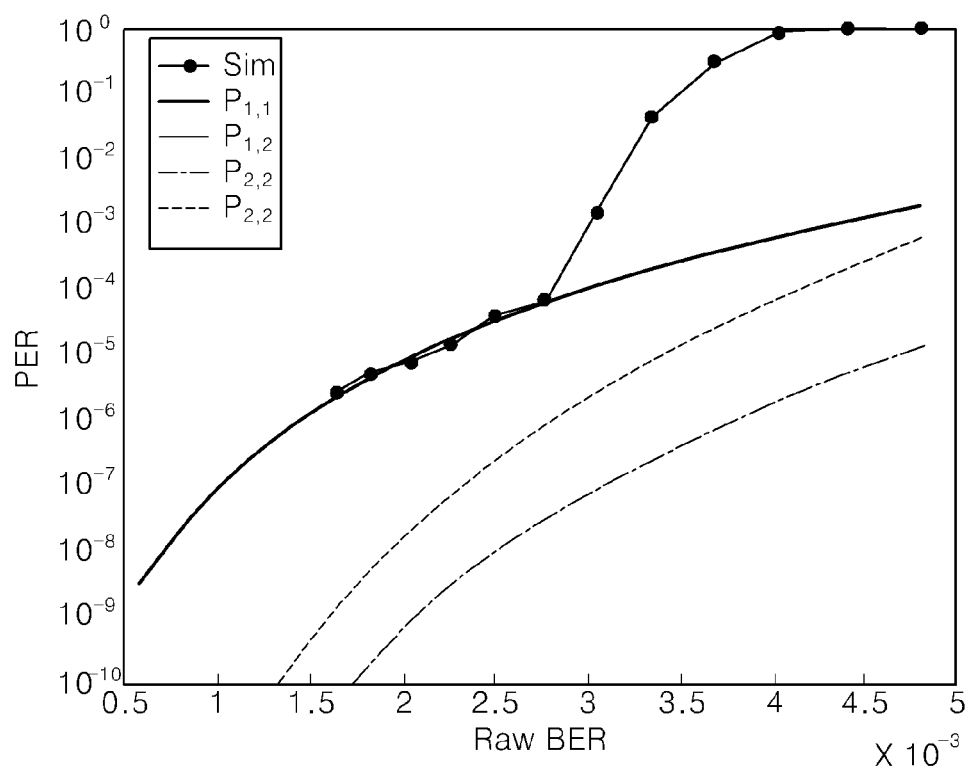
FIG. 8 is a diagram illustrating comparison between a lower bound based on a block-wise error and an experiment result of the present disclosure.

Meanwhile, the block-wise concatenated BCH code is configured block-wise, and thus it may fail in decoding by an error block. Referring to FIG. 7, it can be confirmed that an error floor occurs by a lower bound of the error block. As shown in FIG. 7, the error floor occurs mainly by a small number of error blocks.

Accordingly, in the present disclosure, a method of obtaining additional information for the small number of error blocks and correcting the error blocks to solve the error floor is proposed. Only when the block-wise concatenated BCH code fails in hard decision repetition decoding, the additional information is used restrictedly to the small number of error blocks, and thus it is possible to effectively reduce complexity and a decoding delay time.

When there is no separate expression in the following description, the concatenated BCH code means the block-wise concatenated BCH code.

Hereinafter, a specific technique to be embodied in the present disclosure will be described in detail with reference to the accompanying drawings.

Figure 2:
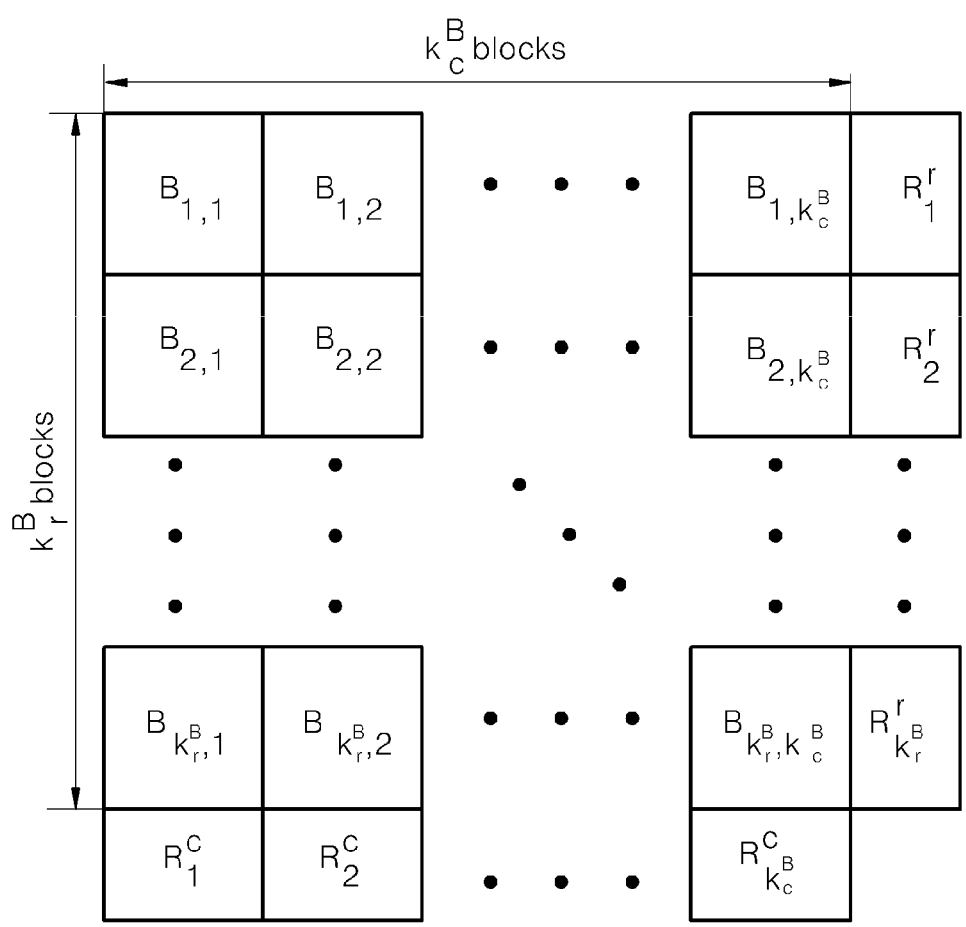
FIG. 2 is a structural diagram illustrating an aspect in which concatenated BCH codes used in the present disclosure are configured in parallel concatenation.
Figure 3:
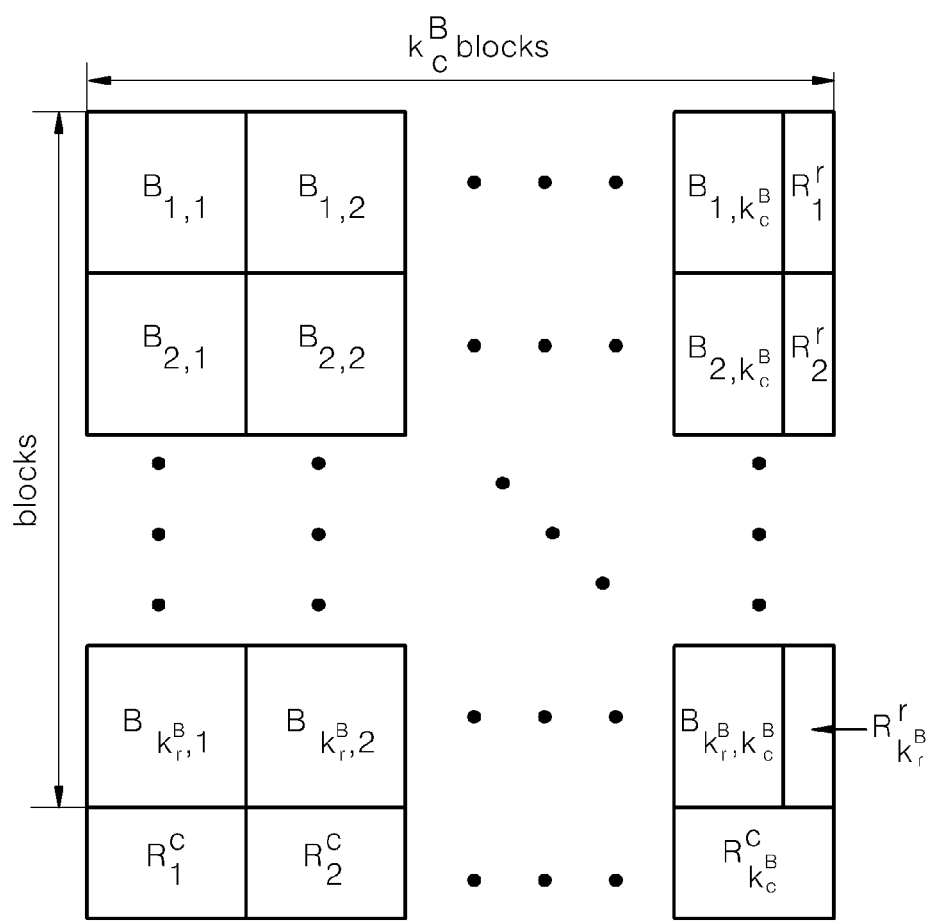
FIG. 3 is a structural diagram illustrating an aspect in which concatenated BCH codes used in the present disclosure are configured in serial concatenation.

FIG. 2 is a structural diagram illustrating a form in which a concatenated BCH code used in the present disclosure is configured in parallel concatenation, and FIG. 3 is a structural diagram illustrating a form in which a concatenated BCH code used in the present disclosure is configured in serial concatenation.

The blocks of the concatenated BCH code are different from the memory blocks, and have the other meaning. The blocks are shown in a group of bits as rectangles in FIG. 2 or FIG. 3, but the bits in the block are arranged in line, and have regular sequence. The block may include a message block, a parity block, or a message-parity block in which a parity block is integrated at the rear of a message block.

As the concatenated BCH codes, there are two kinds of constituent codes, and these are referred to as a row code and a column code for convenience. In the parallel concatenation structure, a role of the row code is the same as that of the column code, and thus the row code and the column code can be replaced by each other. In the serial concatenation structure, the row code serves an outer code, and the column code serves as an inner code, which cannot be replaced by each other. One row code and one column code always share one block each other, and do not share the other blocks each other. In addition, one row code (or the column code) shares only one block with all the column codes (or the row codes).

Both of the row code and the column code are the BCH codes. The row code may correct $t_r$ bit errors in the entire code by total $n_r$ bits, a protective message $k_r$ bits, and a parity $m_r$ bits. The column code may correct $t_c$ bit errors in the entire code by total $n_c$ bits, a protective message $k_c$ bits, a parity $m_c$ bits.

Hereinafter, in the description of embodiments, a size of data protected by the concatenated BCH code is k (k is a natural number).

FIG. 2 is a structural diagram illustrating that the concatenated BCH code used in the present disclosure is configured in parallel concatenation.

Referring to FIG. 2, data corresponds to a message matrix having a size of $k_r^B \times K_c^B$ formed of message blocks. One row code is formed of $k_c^B$ message blocks and one or more parity blocks. One column code is formed of $k_r^B$ message blocks and one or more parity blocks.

For example, each message block may have a configuration of a parallel concatenated BCH code including $n_B$ bits. Referring to FIG. 2, the i-th row code is formed of the message blocks of the i-th row and the parity blocks of the i-th row, and may be represented by Formula 1.

$$C_i^r = [B_{i,1} \ldots B_{i,k_c^B} R_i^r]$$ [Formula 1]

Referring to FIG. 2, the j-th column code is formed of the message blocks of the j-th column and the parity blocks of the j-th column, and may be represented by Formula 2.

$$C_j^c = [B_{1,j} \ldots B_{k_c^B,j} R_j^c]$$ [Formula 2]

In this case, the message length of the row code may be represented by Formula 3.

$$k_r = k/k_r^B = n_B \times k_r^B$$ [Formula 3]

In addition, the code length of the row code may be represented by Formula 4.

$$n_r = k_r + m_r$$ [Formula 4]

Similarly, the message length of the column code may be represented by Formula 5.

$$k_c = k/k_c^B = n_B \times k_r^B$$ [Formula 5]

Similarly, the code length of the column code may be represented by Formula 6.

$$n_c = k_c + m_c$$ [Formula 6]

In this case, a code rate of the parallel concatenated BCH code may be represented by Formula 7

[Formula 7]

$$R = \frac{k}{(k + m_r k_r^B + m_c k_c^B)}$$

In the embodiment, the message block includes $n_B = k/(k_r^B \times k_c^B)$ bits, and the sizes of all the message blocks are the same.

By differently interleaving, in an embodiment having the message blocks with the same size only within one column having the message blocks with different sizes for each different column, the row code is as Formula 1, and the column code may be represented by Formula 8.

$$C_j^C = [B_{1,f(j)} B_{2,f(j+1)} \ldots B_{k_r^B,f(j+k_y^B-1)} R_j^c]$$ [Formula 8]

where $f(x) = \{(x-1) \mod k_c^B\} + 1$

FIG. 3 is a structural diagram illustrating a form in which the concatenated BCH codes used in the present disclosure are configured in serial concatenation.

Referring to FIG. 3, data is assigned to message blocks, and the last message block of each row is integrated into the parity block of the row code of the corresponding row or a part thereof to be a message-parity block. Except for the parity block of the column code, the message block, the message-parity block of each row, and extra parity blocks of each row form a message matrix with a size of $K_r^B \times K_c^B$. One row code is formed of $k_c^B - 1$ message blocks and one message-parity block. One column code is formed of $k_r^B$ message blocks or message-parity blocks and one parity block. In the case of the serial concatenated BCH code, the column code may be designed to correct more errors than the row code ($t_r \leq t_c$).

For example, each message block and the message-parity block may constitute the serial concatenated BCH code, including the same $n_B$ bits. Referring to FIG. 3, the i-th row code is formed of the message blocks of the i-th row and the parity blocks of the i-th row, and may be represented by Formula 1.

Referring to FIG. 3, the j-th column code is formed of the message blocks of the j-th column and the parity blocks of the j-th column, and may be represented by Formula 9 with respect to $1 \leq j \leq k_c^B$.

$$C_j^c = [B_{1,j} \ldots B_{k_r^B,j} R_j^c]$$ [Formula 9]

In a case of $j = k_c^B$, it may be represented by Formula 10.

$$C_j^c = [\{B_{1,j}, R_1^r\} \ldots \{B_{k_r^B,j}, R_{k_r^B}^r\} R_j^c]$$ [Formula 10]

In this case, the message length of the row code may be represented by Formula 11.

$$k_r = k/k_r^B$$ [Formula 11]

In addition, the code length of the row code may be represented by Formula 12.

$$n_r = k_r + m_r = n_B \times k_c^B$$ [Formula 12]

Similarly, the message length of the column code may be represented by Formula 13.

$$k_c = n_B \times k_r^B$$ [Formula 13]

Similarly, the code length of the column code may be represented by Formula 6.

In this case, a code rate of the serial concatenated BCH code may be represented by Formula 7.

Each message block and the message-parity block in the embodiment of the serial concatenated BCH code includes $n_B = (k + m_r \times k_r^B)/(k_r^B \times k_c^B) = n_r/k_c^B$ bits, and the size of all the message block and the message-parity block are the same as each other.

By differently interleaving, in an embodiment having the message blocks with the same size only within one column having the message blocks with different sizes for each different column, the row code is as Formula 1, and the column code may be represented in a similar method as Formula 8.

Figure 4:
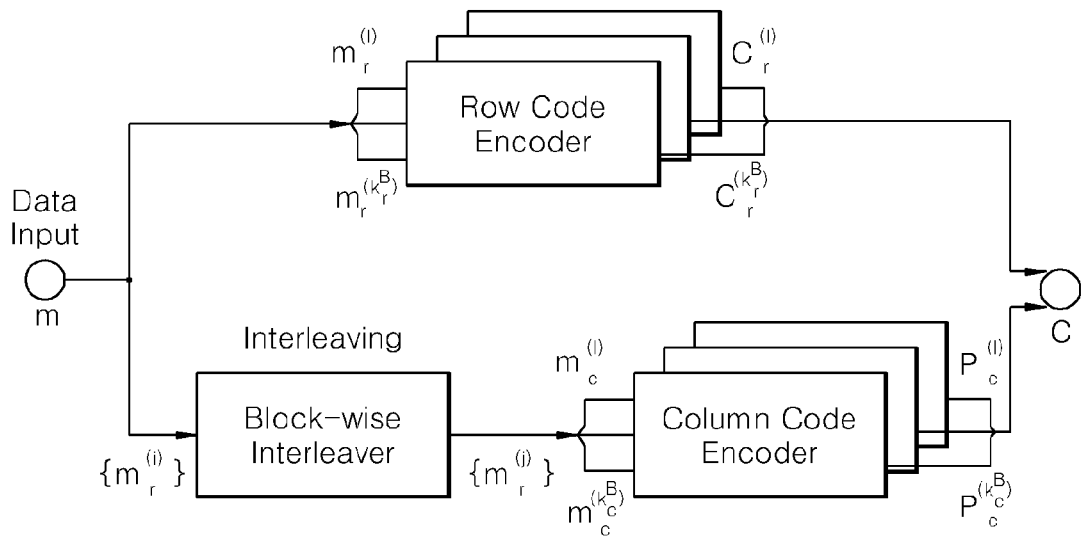
FIG. 4 is a functional block diagram illustrating a parallel concatenated BCH encoding circuit of a flash memory device according to a first embodiment of the present disclosure.

FIG. 4 is a functional block diagram illustrating the parallel concatenated BCH encoding circuit of the flash memory according to the first embodiment of the present disclosure.

As shown in FIG. 4, the parallel concatenated BCH encoding circuit includes a first stage encoding unit that receives a part or all of data (m) input to a flash memory core, performs BCH encoding, and outputs a first output BCH code or a parity bit thereof, an interleaving unit that receives a part or all of the data input to the flash memory core, interleaves, and outputs the data, and a second stage encoding unit that performs BCH encoding of the BCH code or data that is the output of the interleaving unit, and outputs a second output BCH code or a parity bit thereof. Herein, the first stage encoding unit is a row encoder, the interleaving unit is a block-wise interleaver, and the second stage encoding unit is a column encoder.

Referring to FIG. 4, the data (m) input to be stored in the flash memory core is divided into $m_r^{(1)}, \ldots, m_r^{k_y^B}$, and is applied to the row encoder, or is applied to the block-wise interleaver, is changed to $m_c^{(1)}, \ldots, m_c^{k_c^B}$, and is applied to the column encoder.

The row encoder and the column encoder are systematic encoders, and the message block and the parity block may be simultaneously output from the row encoder or the column encoder. The row encoder and the column encoder output at least the parity block of the corresponding code. The message block of the row encoder, the message block of the column encoder, or the message bock of the input data may be output as the message block of the encoding circuit output. The outputs of the row encoder and the column encoder, or the row encoder, the column encoder, and the data input terminal are combined to generate a code word to be stored in the flash memory core.

In FIG. 4, the row encoder simultaneously outputs the message block and the parity block, and the column encoder outputs the parity block to generate a code word to be stored. In FIG. 4, the row encoder and the column encoder are configured in parallel, but the both encoders may be configured in series irrespective of the sequence of both encoders and an interleaver may be interposed between both encoders in series.

Figure 5:
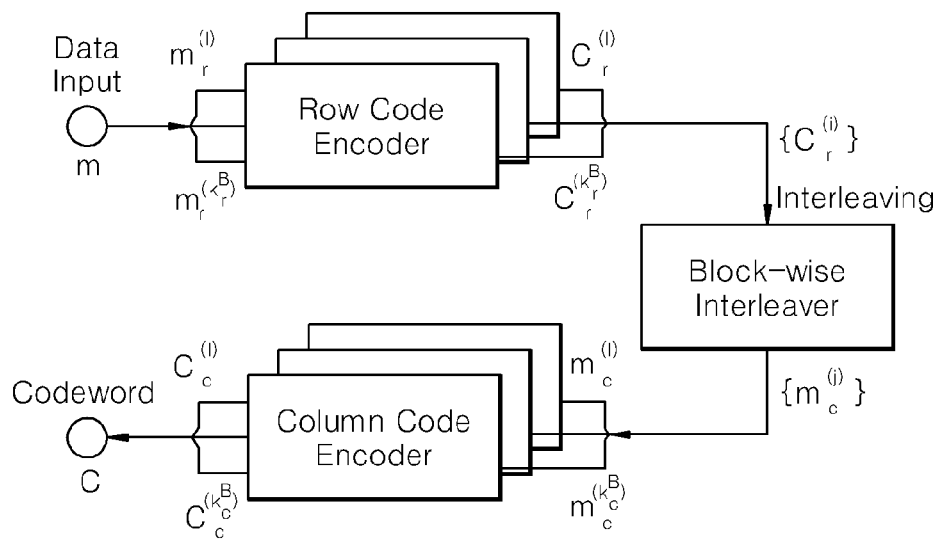
FIG. 5 is a functional block diagram illustrating a serial concatenated BCH encoding circuit of a flash memory device according to a first embodiment of the present disclosure.

FIG. 5 is a functional block diagram illustrating a serial concatenated BCH encoding circuit of the flash memory device according to the first embodiment of the present disclosure.

As shown in FIG. 5, the serial concatenated BCH encoding circuit includes a first stage encoding unit that receives a part or all of data input to a flash memory core, performs BCH encoding, and outputs a first output BCH code or a parity bit thereof, an interleaving unit that interleaves the first output BCH code or data protected thereby, and a second stage encoding unit that performs BCH encoding of the BCH code or data that is the output of the interleaving unit, and outputs a second output BCH code or a parity bit thereof. Herein, the first stage encoding unit is a row encoder, the interleaving unit is a block-wise interleaver, and the second stage encoding unit is a column encoder.

Referring to FIG. 5, the data (m) input to be stored in the flash memory core is divided into $m_r^{(1)}, \ldots, m_r^{k_r^B}$, and is applied to the row encoder. The column code is applied to the block-wise interleaver, is changed to $m_c^{(1)}, \ldots, m_c^{k_c^B}$, and is applied to the column encoder. The row encoder and the column encoder are systematic encoders, and the message block and the parity block may be simultaneously output from each encoder. The row encoder and the column encoder output at least the parity block of the corresponding code. The message block of the row encoder, the message block of the column encoder, or the message bock of the input data may be output as the message block of the encoding circuit output. The outputs of the row encoder and the column encoder, or the row encoder, the column encoder, and the data input terminal are combined to generate a code word to be stored in the flash memory core.

In FIG. 5, each of the row encoder and the column encoder simultaneously outputs the message block and the parity block corresponding to each code and generates a code word to be stored. In FIG. 5, the row encoder and the column encoder are configured in series, but both encoders may be configured in parallel, and the column encoder may have a structure of progressing the encoding with the input data, receiving the parity block passing through the column encoder and the interleaver, continuously progressing the encoding, and generating a code work to be stored.

Figure 6:
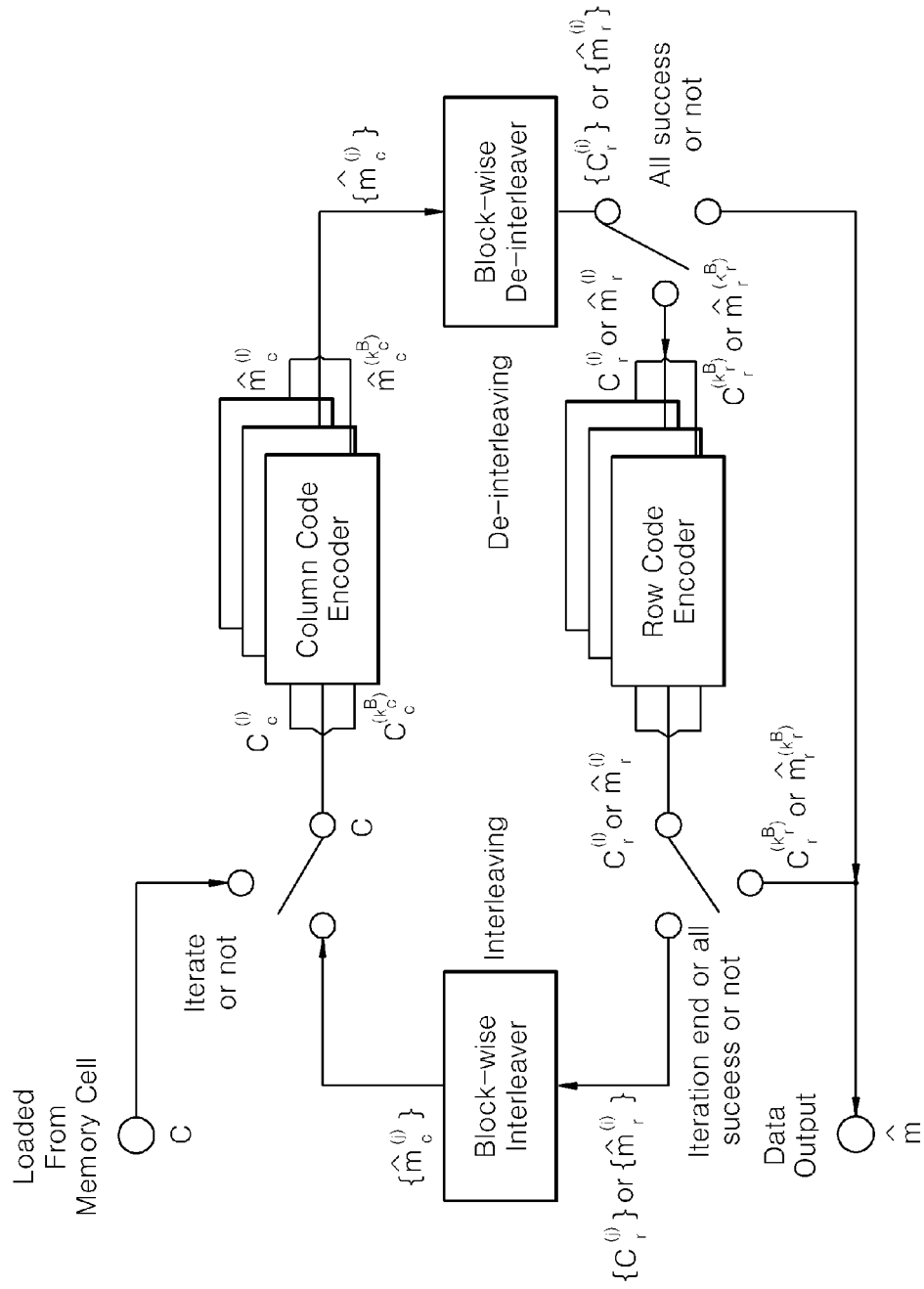
FIG. 6 is a functional block diagram illustrating a concatenated BCH decoding circuit of a flash memory device according to a first embodiment of the present disclosure.

FIG. 6 is a functional block diagram illustrating the concatenated BCH decoding circuit of the flash memory device according to the first embodiment of the present disclosure.

As shown in FIG. 6, the concatenated BCH decoding circuit includes a first stage decoding unit that receives a part of concatenated BCH codes, performs BCH decoding, and outputs a first output BCH code or first output data protected thereby, a de-interleaving unit that divides the first output BCH code or the first output data into two or more blocks, de-interleaves, and outputs the blocks, a second stage decoding unit that performs BCH decoding of the output of the de-interleaving unit, and outputs a second output BCH code or second output data protected thereby, and an interleaving unit that divides the second output BCH code or the second output data into two or more blocks, interleaves, and outputs the blocks to the first stage decoding unit.

Herein, the first stage decoding unit is a column decoder, the de-interleaving unit is a block-wise de-interleaver, the second stage decoding unit is a row decoder, and the interleaving unit is a block-wise interleaver.

The concatenated BCH decoding circuit repeats row decoding and column decoding in a repetition decoding manner. The repetition end is declared by the maximum number of repetition times or a repetition end condition. The repetition end condition may a condition in which all the codes failing in decoding up to the previous repetition in the column code and the row code during one repetition continuously fail in decoding. This condition means a state where the error is not corrected any more even when the repetition decoding continuously proceeds.

Referring to FIG. 6, n-bit storage data read in a memory cell of the flash memory core is divided into $k_c^B$ column codes, and the column codes are applied to the column decoder, are decoded by the BCH decoder, and then are output as $k_c^B$ column messages. The $k_c^B$ column messages pass through the block-wise de-interleaver. In the case of the parallel concatenated BCH code, $k_r^B$ row messages are output, and in the case of serial concatenated BCH code, $k_r^B$ row codes including row messages are output. When the column decoder succeeds in decoding for $k_c^B$ column codes, the row messages or the row messages that is a part of the row codes are immediately output as data. Otherwise, the $k_r^B$ row messages or row codes are applied to the row decoder, are decoded by the BCH decoder, and then are output as $k_r^B$ row message or $k_r^B$ row codes including the row messages. When the repetition end is declared or the row decoder succeeds in decoding for all the $k_r^B$ row codes, the row message or the row message included in the row codes are immediately output as data. Otherwise, they are applied to the block-wise interleaver, and $k_c^B$ column messages are output. To progress the repetition decoding, the $k_c^B$ column messages are applied to the column decoder again.

FIG. 7 is a diagram illustrating a concatenated BCH multistage decoding method of the flash memory device according to the first embodiment of the present disclosure.

In the present disclosure, a concatenated encoding system of adoptively reducing complexity and a decoding delay time using the block-wise concatenated BCH codes is designed. The concatenated encoding system is configured by at least three levels.

The first level is an error correction step in constituent codes of the block-wise concatenated BCH codes. The constituent codes are a part of the block-wise concatenated BCH codes, and thus it is possible to correct the error with relatively low complexity and a short delay time when only the constituent codes are decoded. The code length of the constituent codes is relatively long, and thus it is possible to correct a relatively large amount of errors even at the high code rate. The constituent codes may be a part of pages, and may be column codes or row codes. In a file system of storing data in the flash memory core, it is possible to design the constituent codes according to a data access unit size of the file system to efficiently perform data access of the flash memory core. For example, in a file system of performing data access by 512 bytes, the constituent codes may be designed such that the message length of the constituent code is 512 bytes, that is, 4096 bits, and it is possible to efficiently perform the data access. Probability that the constituent codes fail in correction is the same as Formula 14 when the code length is $n_c$, the correctable bit number is $t_c$, and the initial error probability is $P_e$.

$$P_{L1}^e = \sum_{n_e=t_c+1}^{n_c} \binom{n_c}{n_e} P_e^{n_e}(1-P_e)^{n_c-n_e} \quad \text{[Formula 14]}$$

The second level is a step of decoding the entire concatenated BCH codes and correcting an error which is not corrected in the first level when a lot of errors occur and the constituents codes fail in error correction. The decoding of the concatenated BCH code has been described with reference to FIG. 6. Since the concatenated BCH code is formed block-wise, it fails in decoding by the error block, and it fails in decoding mainly by a small number of error blocks in a low error rate area where the flash memory core is operated. Decoding failure probability by such a small number of error blocks may be calculated as Formula 15. As an example, Formula 15 represents the decoding failure probability by one error block in the parallel concatenated BCH code in which all the message blocks are the same size.

$$P_{1,1} = \binom{k_r^B}{1}\binom{k_c^B}{1} \cdot \sum_{n_1^e=1}^{n_B} \sum_{n_2^e=0}^{m_r} \sum_{n_3^e=0}^{m_c} \binom{n_B}{n_1^e}\binom{m_r}{n_2^e} \quad \text{[Formula 15]}$$

$$\binom{m_c}{n_3^e} P_e^{n_e}(1-P_e)^{n_B+m_c+m_r-n_e} \cdot 1_{S_{1,1}}$$

In Formula 15, $P_{i,j}$ represents error probability by i decoding failure row codes and j decoding failure column codes, and $P_e$ indicates an average raw bit error rate. In addition, $n_B$ represents a message block size, $m_r$ represents parity block size of one row code, $m_c$ represents a parity block size of one column code, $n^e(=n_1^e+n_2^e+n_3^e)$ represents the number of all occurring bit errors, $n_1^e$ represents the number of bit errors occurring in the message block, $n_2^e$ represents the number of bit errors occurring in the parity block of one row code, and $n_3^e$ represents the number of bit errors occurring in the parity block of one column code. $1_{S_{1,1}}$ is a logic value which is 1 when a condition $S_{1,1}$ is satisfied, and otherwise is 0. In this case, the condition $S_{1,1}$ represents $t_r<n_1^e+n_2^e$, and $t_r<n_1^e+n_3^e$. That is, it represents a condition in which the number of bit errors occurring in one error block and a parity block of one row code is large as much as row codes to which the blocks belong cannot correct the errors, and the number of bit errors occurring in one error block and a parity block of one column code is large as much as the column codes to which the blocks belong cannot correct the errors. Formula 16 represents decoding failure probability by two error blocks in one row in the parallel concatenated BCH code in which all the message blocks have the same sizes.

$$P_{2,1} = \quad \text{[Formula 15]}$$

$$\binom{k_r^B}{1}\binom{k_c^B}{1} \cdot \sum_{n_1^e=1}^{n_B} \sum_{n_2^e=0}^{n_B} \sum_{n_3^e=0}^{m_r} \sum_{n_4^e=0}^{m_c} \sum_{n_5^e=0}^{m_c} \binom{n_B}{n_1^e}\binom{n_B}{n_2^e}\binom{m_r}{n_3^e}$$

-continued $$\binom{m_c}{n_4^e}\binom{m_c}{n_5^e} P_e^{n_e}(1-P_e)^{2n_B+m_r+2m_c-n_e} \cdot 1_{S_{2,1}}$$

In Formula 16, $P_{i,j}$ represents error probability by i decoding failure row codes and j decoding failure column codes, and $P_e$ represents an average raw bit error rate. In addition, $n_B$ represents a message block size, $m_r$ represents parity block size of one row code, $m_c$ represents a parity block size of one column code, $n^e(=n_1^e+n_2^e+n_3^e+n_4^e+n_5^e)$ represents the number of all occurring bit errors, $n_1^e$ represents the number of bit errors occurring in the first message block, $n_2^e$ represents the number of bit errors occurring in the second message block, $n_3^e$ represents the number of bit errors occurring in a parity block of one row code, $n_4^e$ means the number of bit error occurring in a parity block of the first column code, and $n_5^e$ means the number of bit errors occurring in a parity block of the second column code. $1_{S_{2,1}}$ is a logic value which is 1 when a condition $S_{2,1}$ is satisfied, otherwise is 0. In this case, the condition $S_{2,1}$ represents 1) $t_r<n_1^e+n_2^e+n_3^e$, 2) $t_c<n_1^e+n_4^e$, and 3) $t_c<n_2^e+n_5^e$. When the lower bound is acquired in such a manner, it is possible to confirm that the performance measurement result by computer simulation of the concatenated BCH code is restricted by the lower bound as shown in FIG. 7.

The performance of the concatenated BCH code is restricted by the lower bound means that the decoding failure occurs by the error block indicated by the lower bound. For example, referring to FIG. 7, when the raw-bit error rate is below $2.75 \times 10^{(-3)}$ and the concatenated BCH code is decoded, decoding failure occurs mostly by one error block.

When the decoding failure occurs in the concatenated BCH code used in the present disclosure, the position of the error block is determined by constituent codes failing in decoding. Accordingly, when the decoding failure occurs by the error block, it is possible to perform the additional operation only for the corresponding error block.

Figure 10:
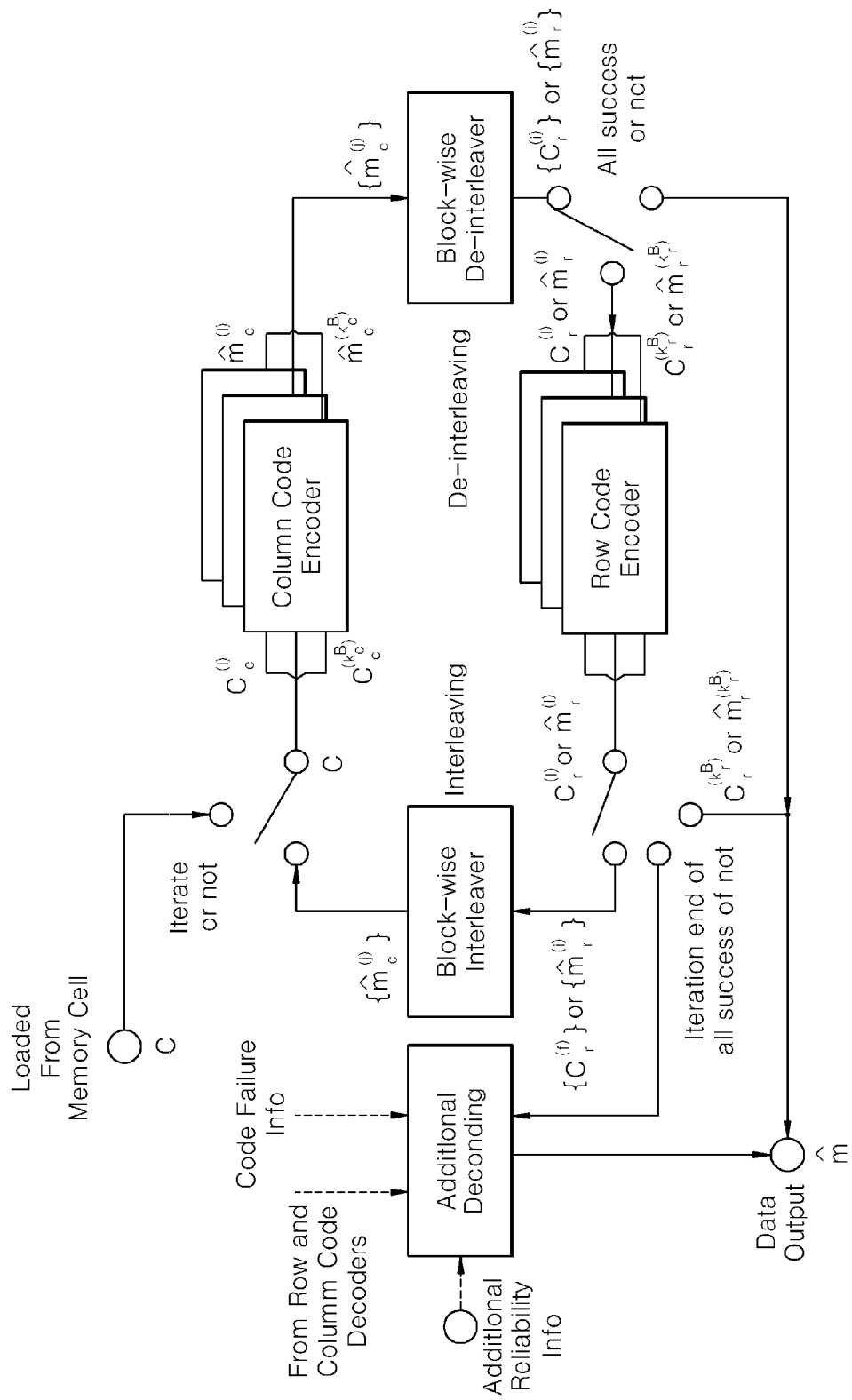
FIG. 10 is a functional block diagram illustrating a concatenated BCH multi-stage decoding circuit capable of additional decoding of a flash memory according to a first embodiment of the present disclosure.

The third level is a step of obtaining only the additional information corresponding to the error block when the decoding failure of the concatenated BCH code occurs for a small number of error blocks, performing the additional decoding with relatively low complexity, and correcting more errors than that of the second level. Referring to FIG. 10, when the repetition end is declared in the hard decision repetition decoding of the concatenated BCH code, the additional decoding is progressed, both of the row decoder and the column decoder receive the decoding failure or success of the constituent codes for the additional decoding, and the positions of the small number of error blocks are confirmed. The additional information is information about bits corresponding to the small number of error blocks, the positions of which are confirmed. For example, the information may be obtained by reading the cells in which the bits are stored or the peripheral cells thereof in the flash memory core, or may be obtained by in a method of determining the bit value by changing the reading reference threshold voltage value of determining the bit value for the threshold voltage of the cell in which the bits are stored, to the previous reading reference threshold voltage, and applying the value. The additional decoding method is a decoding method using the additional information. For example, a reliability-based decoding method such as chase decoding may be used.

Hereinafter, a difference in performance between the error correction circuit using the concatenated code of the present disclosure and the existing error correction circuits will be described.

Figure 9:
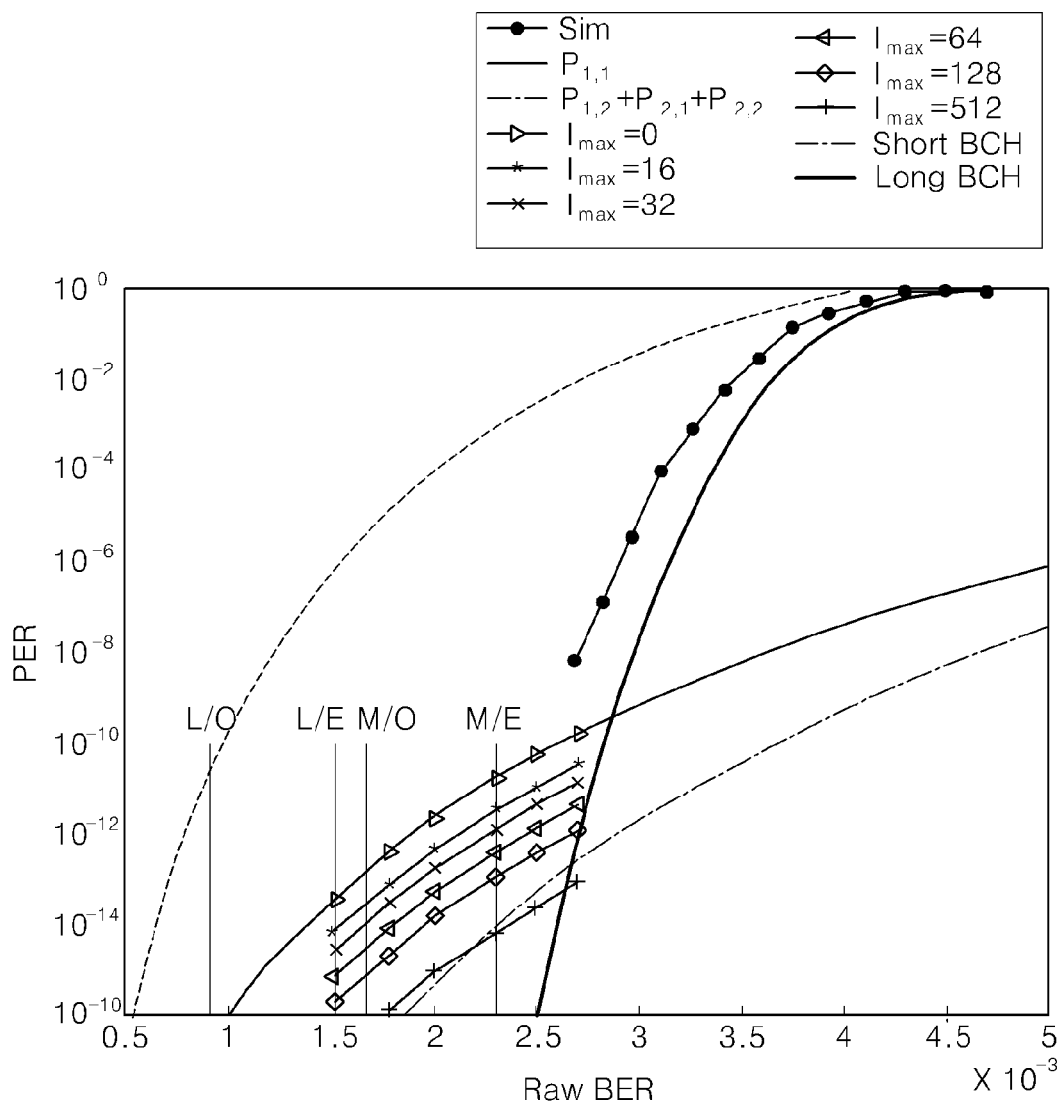
FIG. 9 is a diagram illustrating comparison an experiment result of a decoding method using additional information for solving one block error of the present disclosure and performance of the existing BCH code.

Referring to FIG. 9, Sim. is a result of computer simulation for the performance of parallel concatenated BCH code (70528, 65536) formed of 16 row codes ((4226, 4096, 10) BCH codes) and 16 column codes ((4278, 4096, 14) BCH codes).

$I_{max}$ represents the maximum number of try times in the reliability-based decoding method, and $I_{max}=N$ means the performance when the reliability-based decoding of the maximum number of try times of N is performed in the third level. In FIG. 9, as the reliability-based decoding method, a method of selecting a predetermined number of bits and reversing the values is used. When the reliability-based decoding in which the maximum number of try times is 512 for one block error is performed, it can be known that most of one error block may be corrected for a target page-error rate. Table 1 shows that the average number of try times is small when the maximum number of try times is 16, 32, 64, 128, and 512 in FIG. 9. This means that the decoding of the third level is performed with relative low complexity.

TABLE 1

| | Maximum Number of Try Times | | | | |
|---|---|---|---|---|---|
| | 16 | 32 | 64 | 128 | 512 |
| Average Number of Try Times | 7.476 | 9.461 | 11.220 | 11.948 | 12.657 |

Referring to FIG. 9, it can be known that the error correction performance of the third level represented by Sim. is more excellent that a code represented by Short BCH. The Short BCH is codes (4278, 4096, 24) in which the BCH codes of correcting 24 bits per 512 bytes is applied to 8 KB. Two codes represented by Short BCH and Sim. have the same code rate (0.929), the code lengths are the same, and the numbers of parity bits are the same.

Referring to FIG. 9, it can be known that the error correction performance of the third level represented by Sim. is not greatly different form the code represented by Long BCH. The Long BCH is a BCH code (70534, 65536, 295) of correcting 295 bits per 8 KB. Two bodes represented by Long BCH and Sim. have the same code rate (0.929), the code lengths are substantially the same, and the numbers of parity bits are substantially the same. The code represented by the Long BCH has the maximum performance which can be achieved by a simple BCH code, but complexity and a delay time is too high, and thus the code is an error correction code which is not easily embodied in actual or cannot be used in the flash memory device.

FIG. 10 is a functional block diagram illustrating a concatenated BCH multi-stage decoding circuit capable of additional decoding of the flash memory device according to the first embodiment of the present disclosure.

As shown in FIG. 10, the concatenated multi-stage decoding circuit includes a first stage decoding unit that receives a part of concatenated BCH code, performs BCH decoding, and outputs a first output BCH code or first output data protected thereby, a de-interleaving unit that divides the first output BCH code or the first output data into two or more blocks, de-interleaves, and outputs the blocks, a second stage decoding unit that performs BCH decoding of the output of the de-interleaving unit, and outputs a second output BCH code or second output data protected thereby, an interleaving unit that divides the second output BCH code or the second output data into two or more blocks, interleaves, and outputs the blocks to the first stage decoding unit, and an additional decoding unit that receives decoding failure information in the first and second stage decoding units, receives the second output BCH code or the second output data protected thereby, and performs additional decoding on the decoding failure block.

Herein, the first stage decoding unit is a column decoder, the de-interleaving unit is a block-wise de-interleaver, the second stage decoding unit is a row decoder, and the interleaving unit is a block-wise interleaver.

The additional decoding unit obtains only the additional information corresponding to the error block when the decoding failure of the concatenated BCH code occurs in a small number of error blocks, performs the additional decoding, and correct the error. In this case, the additional information includes information about bits corresponding to the small number of error blocks, the positions of which are determined.

The additional decoding unit receives the decoding failure or success of the constituent codes in both of the first and second stage decoding units for the additional decoding, and determines the positions of the small number of error blocks. The constituent codes are a part or all of pages that are the reading and writing unit, or are column codes or row codes.

Figure 19:
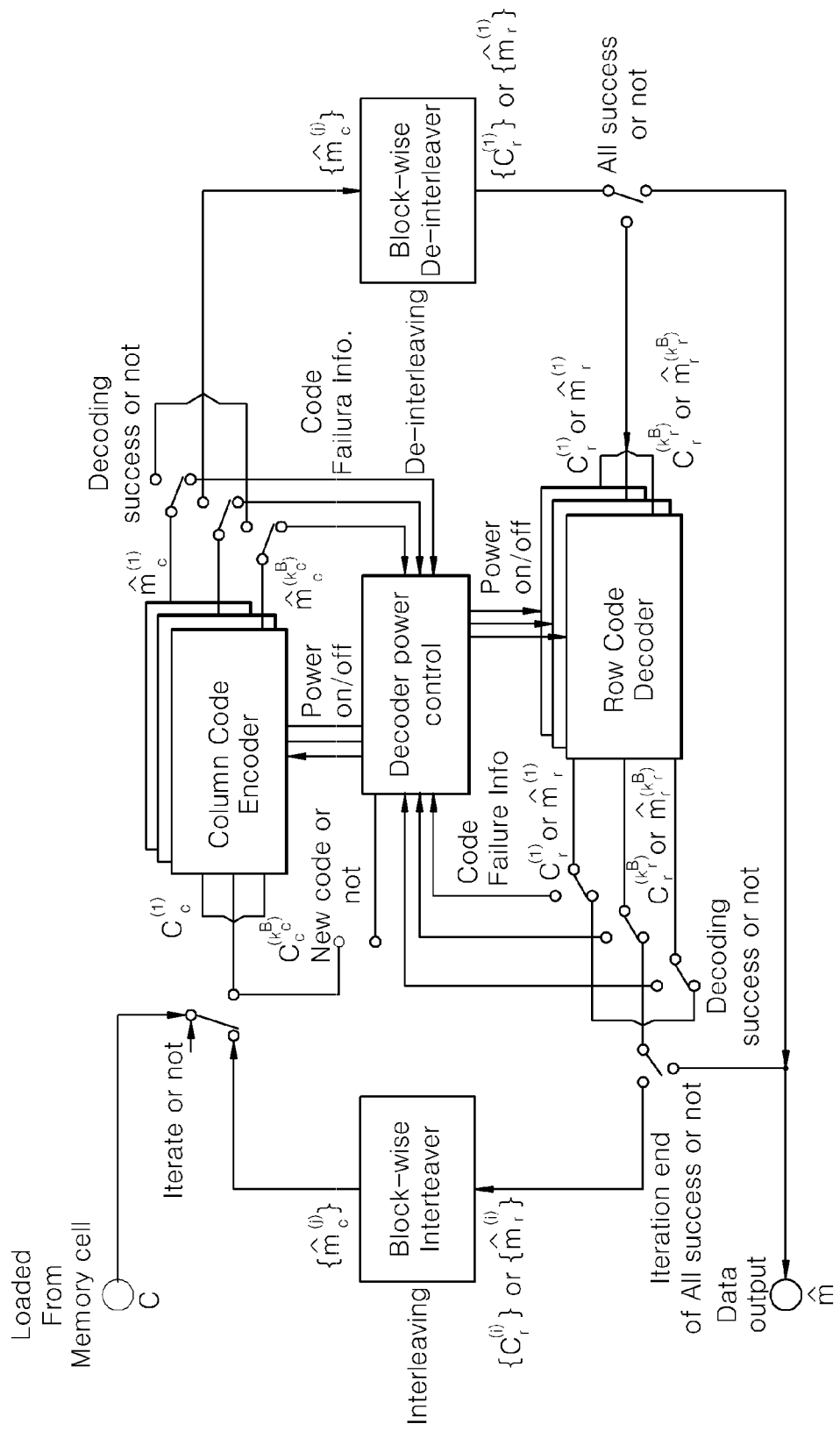
FIG. 19 is a functional block diagram illustrating a concatenated BCH decoding circuit for a flash memory according to a fifth embodiment of the present disclosure.

In addition, although not shown, it is obvious that the concatenated BCH multi-stage decoding circuit shown in FIG. 19 is also additionally provided with a decoder power control unit as shown in FIG. 7, and it is possible to additionally provide a power reducing effect.

Figure 11:
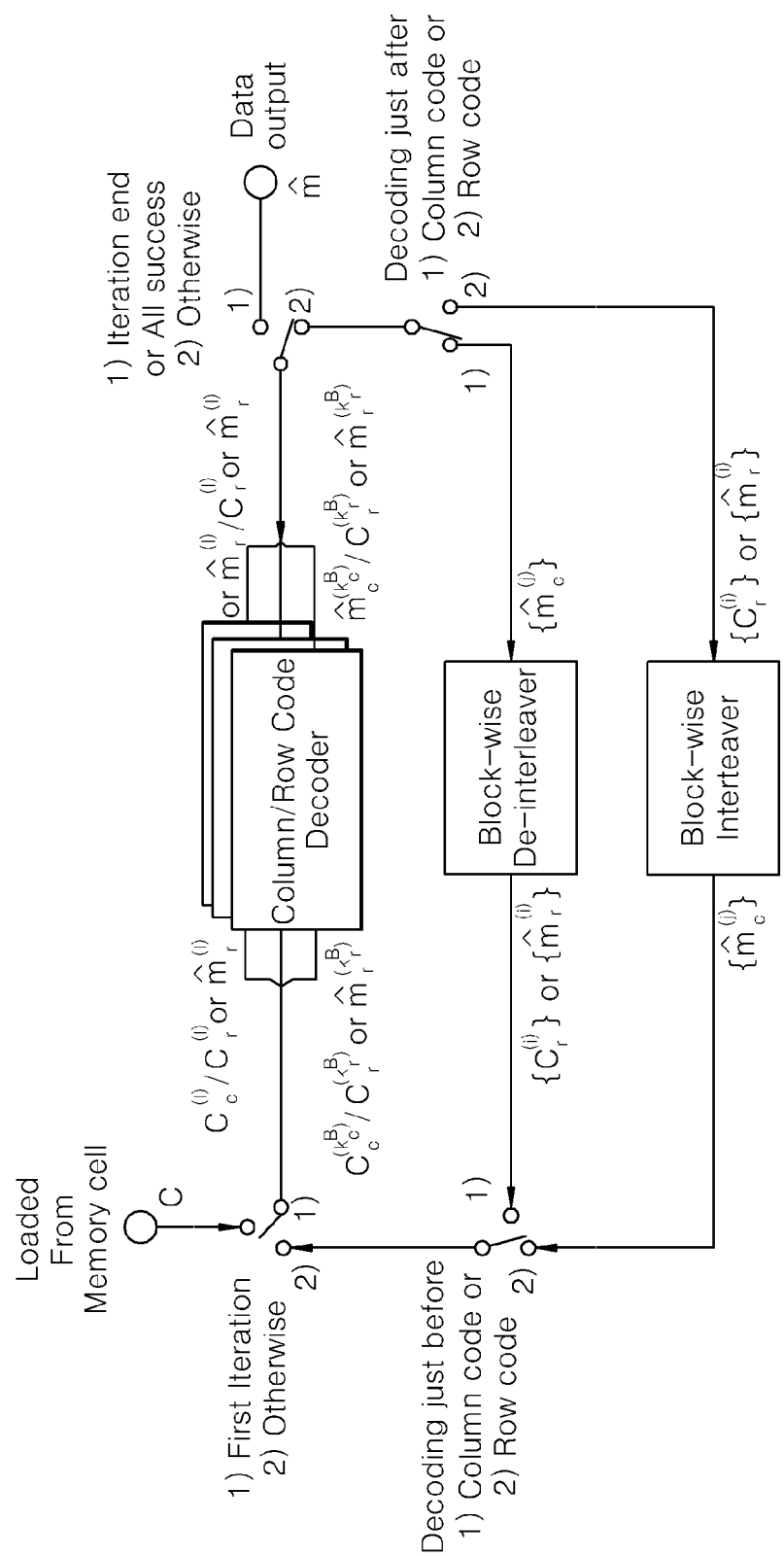
FIG. 11 is a functional block diagram illustrating functional blocks of a concatenated BCH decoding circuit for a flash memory device according to a second embodiment of the present disclosure.

FIG. 11 is a functional block diagram illustrating a concatenated BCH decoding circuit for a flash memory device according to a second embodiment of the present disclosure, which proposes a structure the decoder of the BCH code defined on the same field is shared and used in the column decoder and the row decoder.

Referentially, in the present disclosure, the message lengths of the column code and the row code are designed to be the same, which may be called the BCH codes defined on the same field. In addition, a systematic code in which a message part and a parity part are completely classified in the code is used. In such a situation, when the decoder of the BCH code having high error correction performance is designed, the corresponding decoder may be also used as a decoder of the BCH code having error correction performance lower than that. For example, when a decoder having error correction performance in which the message part is 8192 bits and 100 bits can be corrected is designed, it is possible to decode codes in which error correction performance is smaller than 100 bits in the BCH codes having the message part of the same 8192 bits by the decoder.

Accordingly, the decoder of the concatenated BCH code shown in FIG. 6 requires x (for example, 16) decoders for the row code and the column code, and total 2x decoders has to be provided. However, when the characteristics described above are used and only x decoder is designed and provided, it is possible to decode all of the row code and the column code.

The concatenated BCH decoding circuit shown in FIG. 11 includes a stage decoding unit that receives a part of concatenated BCH code at the first decoding time, receives the output of the de-interleaving unit at the first stage decoding (column decoding) time, receives the output of the interleaving unit at the second stage decoding (row decoding) time, performs BCH decoding, and outputs an output BCH code or output data protected thereby, a de-interleaving unit that divides the output BCH code or the output data of the stage decoding unit into two or more blocks at the first stage decoding (column decoding) completion time, de-interleaves, and outputs the blocks again, and an interleaving unit that divides the output BCH code or the output data of the stage decoding unit into two or more blocks at the second stage decoding (row decoding) completion time, interleaves, and outputs the blocks to the stage decoding unit again.

Herein, the stage decoding unit is a plurality of decoders (column/row decoders) capable of also performing a row decoding operation as well as a column decoding operation, the de-interleaving unit is a block-wise de-interleaver, and the interleaving unit is a block-wise interleaver.

That is, the concatenated BCH decoding circuit shown in FIG. 11 integrates two stage decoding units into one stage decoding unit, the integrated stage decoding unit performs the decoding operation for both of the row code and the column code.

Subsequently, referring to FIG. 11, the repetition decoding operation of the concatenated BCH decoding circuit will be described.

First, the storage data of n bits read in the memory cell of the flash memory device is divided into $k_c^B$ column codes at the first column decoding time, and the column codes are applied to a plurality of decoders.

The storage data is divided into $k_c^B$ column codes, passes through the plurality of decoders, and then the column codes are output as $k_c^B$ column messages. The $k_c^B$ column messages pass through the block-wise de-interleaver. In the case of the parallel concatenated BCH code, $k_r^B$ row messages are output, and in the case of the serial concatenated BCH code, $k_r^B$ row codes are output.

When the plurality of decoders succeed in decoding for $k_c^B$ column codes, the row messages or the row messages that is a part of the row codes are immediately output as data. Otherwise, to perform the row decoding operation, the $k_r^B$ row messages or row codes are applied to the plurality of decoders again, are subjected to BCH decoding, and then are output as $k_r^B$ row message or $k_r^B$ row codes including the row messages.

When the repetition end is declared or the plurality of decoders succeed in decoding for all the $k_r^B$ row codes, the row message or the row message included in the row codes are immediately output as data. Otherwise, to perform the column decoding operation again, it is applied to the block-wise interleaver, $k_c^B$ column messages are output, and it is applied to the plurality of decoders again.

As described above, in the present disclosure, one stage decoding unit capable of performing both of the row decoding operation and the column decoding operation is provided, and thus the number of whole decoders necessary for one decoding is reduced. In such a case, it is possible to provide an effect of reducing the size of the chip having the function of the error correction encoding and the chip producing cost.

In addition, the concatenated BCH encoding and the decoding process used in the present disclosure basically use the row code and the column code, and the block protects two independent row/column codes. In such a case, the messages are overlapped and protected by the codes, and thus the error correction performance is high although the length of the constituent code is short. If the number of times of overlapping and protecting the messages is increased, an additional parity block is necessary, and thus the code rate is decreased, but it is possible to satisfactorily design the code with high error correction performance.

In the present disclosure, a method of increasing the number of times of overlapping and protecting the message blocks is provided. As the first method, as shown in FIG. 12, there is a method of increasing a physical dimension forming the first code to expand to a 3-dimensional code (X/Y/Z axis code) not a 2-dimensional code (row/column code), and as the second method, as shown in FIG. 13, there is a method of changing the manner of combining (row/column/diagonal) the message blocks even in the 2-dimensional code to make a parity block.

Figure 12:
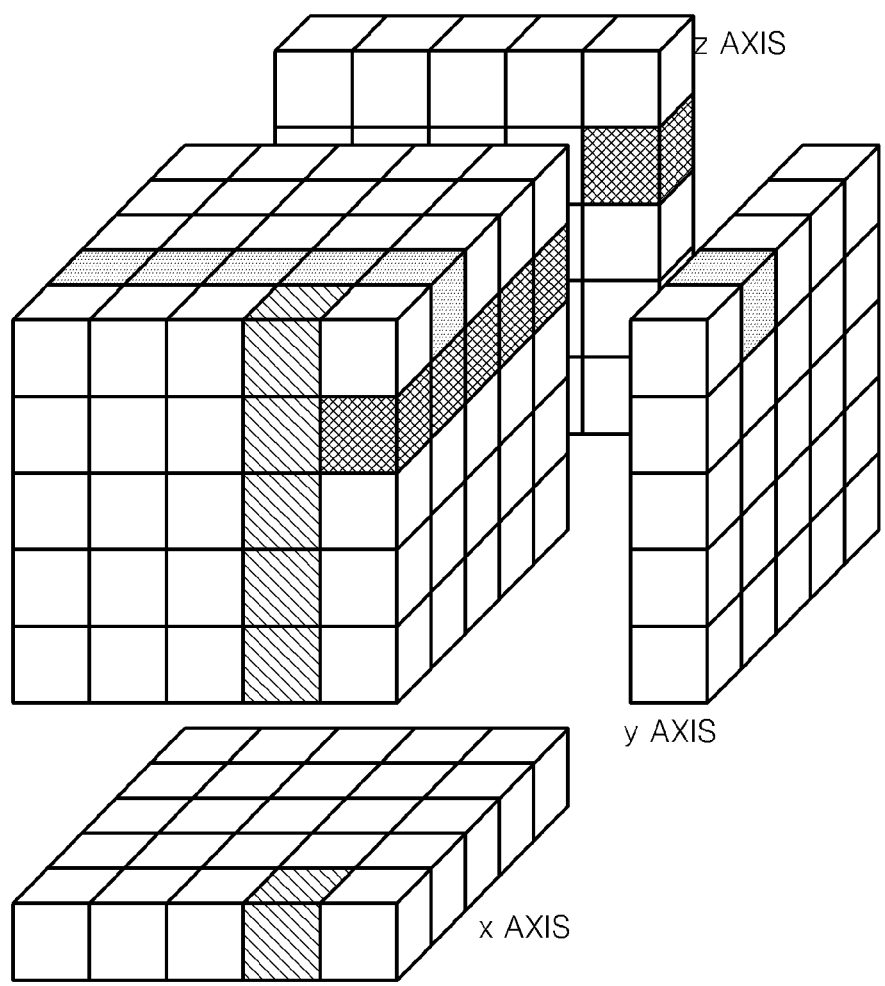
FIG. 12 is a diagram is a diagram illustrating a structure of a concatenated BCH code according to a first embodiment of the present disclosure.
Figure 13:
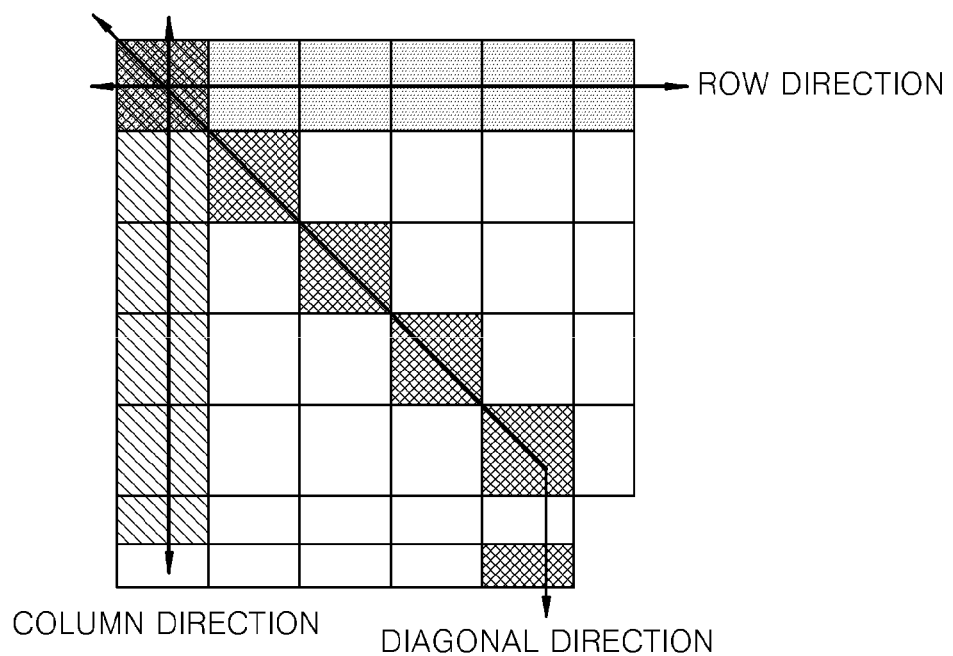
FIG. 13 is a diagram illustrating a structure of a concatenated BCH code according to a second embodiment of the present disclosure.

More specifically, when the data provided from the flash memory device has the structure shown in FIG. 12, the data may include a plurality of codes having the 3-dimensional matrix structure, and an x-axis parity block, a y-axis parity block, and a z-axis parity block assigned each of x axis, y axis, and z axis of the plurality of codes. When the data has the structure shown in FIG. 13, the data may include a plurality of codes having a 2-dimensional matrix structure, and a column direction parity block, a row direction parity block, and a diagonal direction parity block assigned in a column direction, a row direction, and a diagonal direction of the plurality of codes.

In addition, the code in this case has the encoding characteristics having the 2-dimensional matrix structure, as it is. For example, each of the codes has the same message length, is a systematic code in which a message part and a parity part are completely classified, and may be configured block-wise formed of a group of bits. The message length in this case may be determined by the data access unit size of the file system storing the data in the flash memory device.

Figure 14:
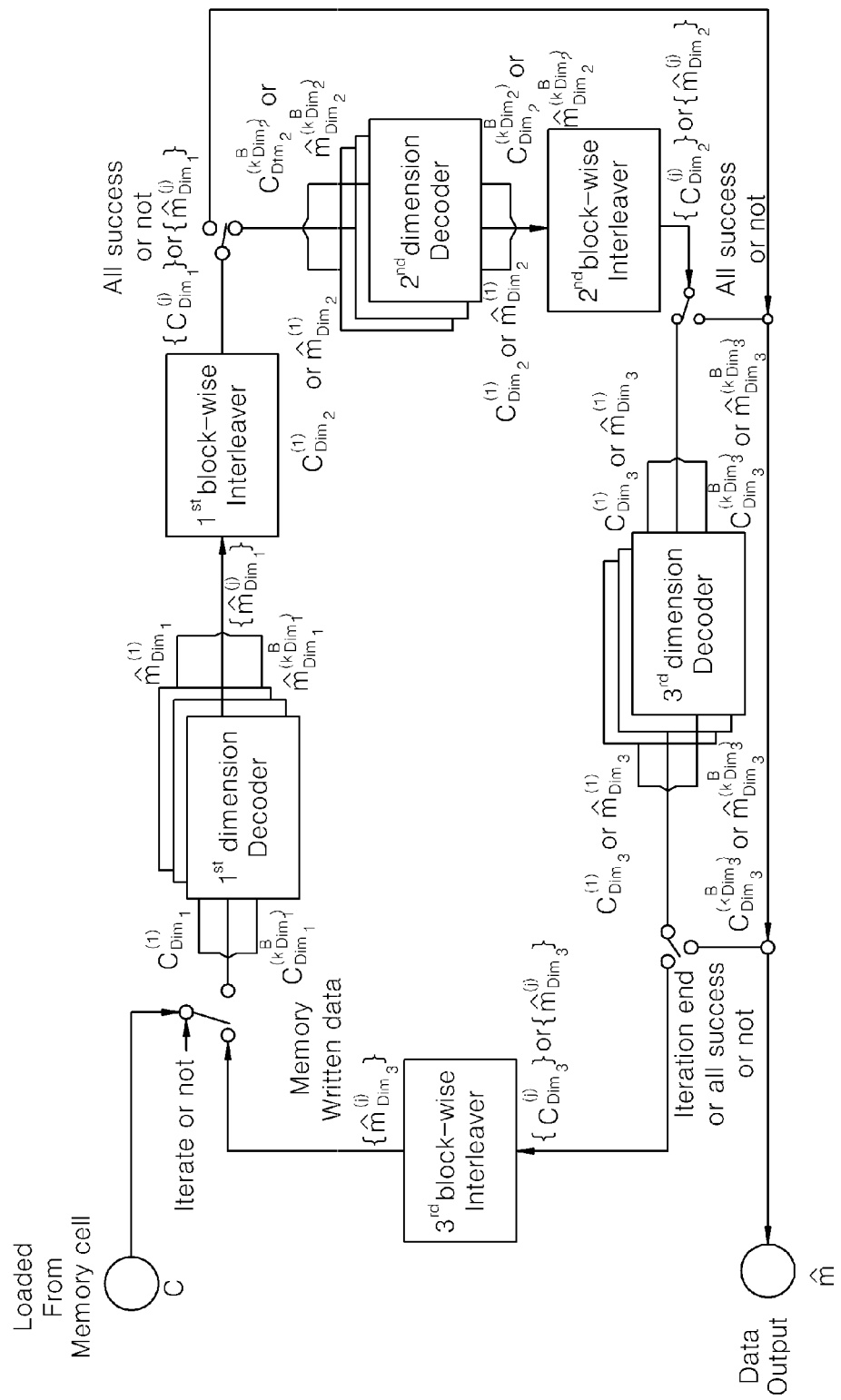
FIG. 14 is a functional block diagram illustrating functional blocks of a concatenated BCH decoding circuit for a flash memory according to a third embodiment of the present disclosure.
Figure 15:
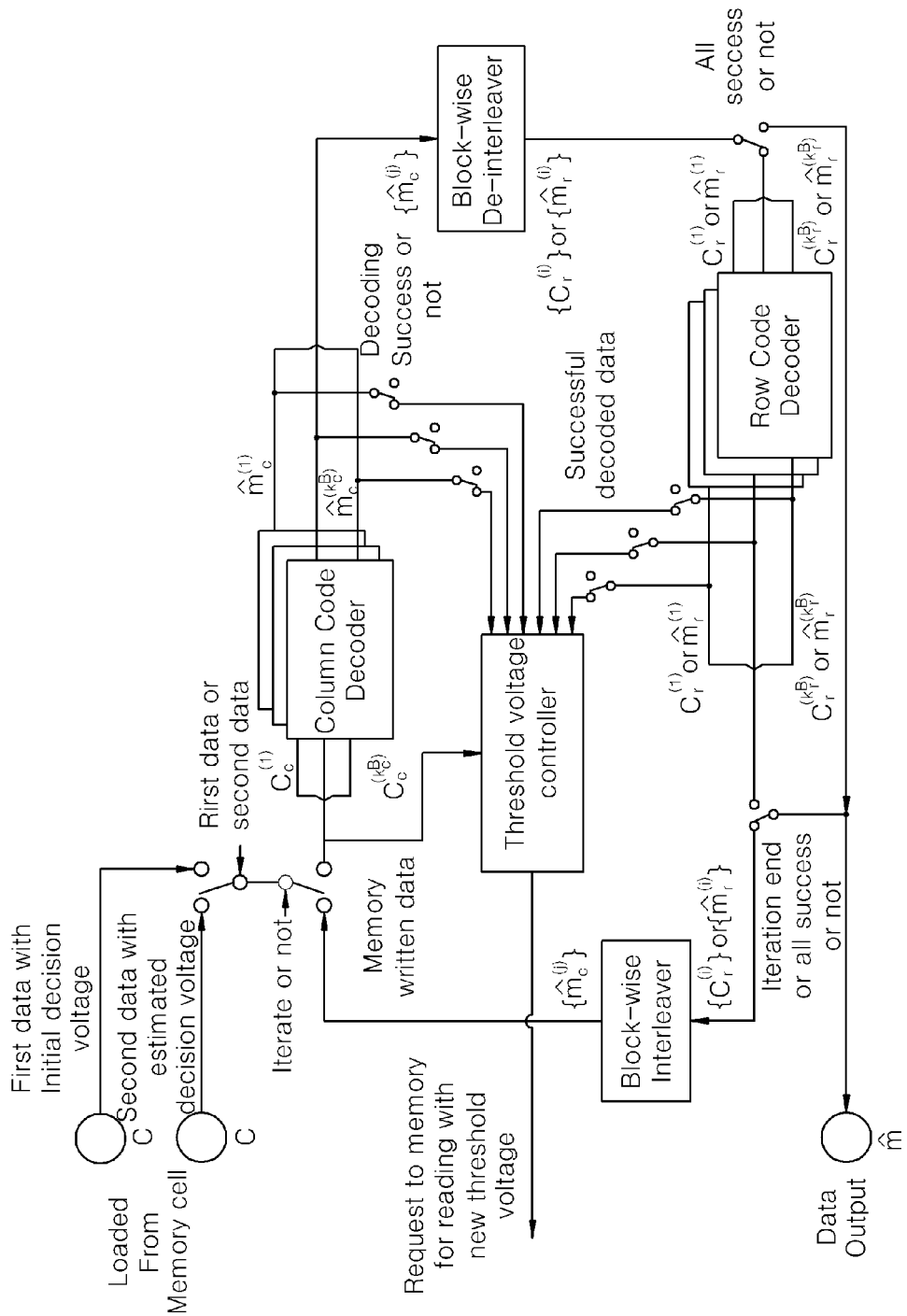
FIG. 15 is a functional block diagram illustrating a concatenated BCH multi-stage decoding circuit capable of redefining threshold voltage of a flash memory device according to a fourth embodiment of the present disclosure.
Figure 16:
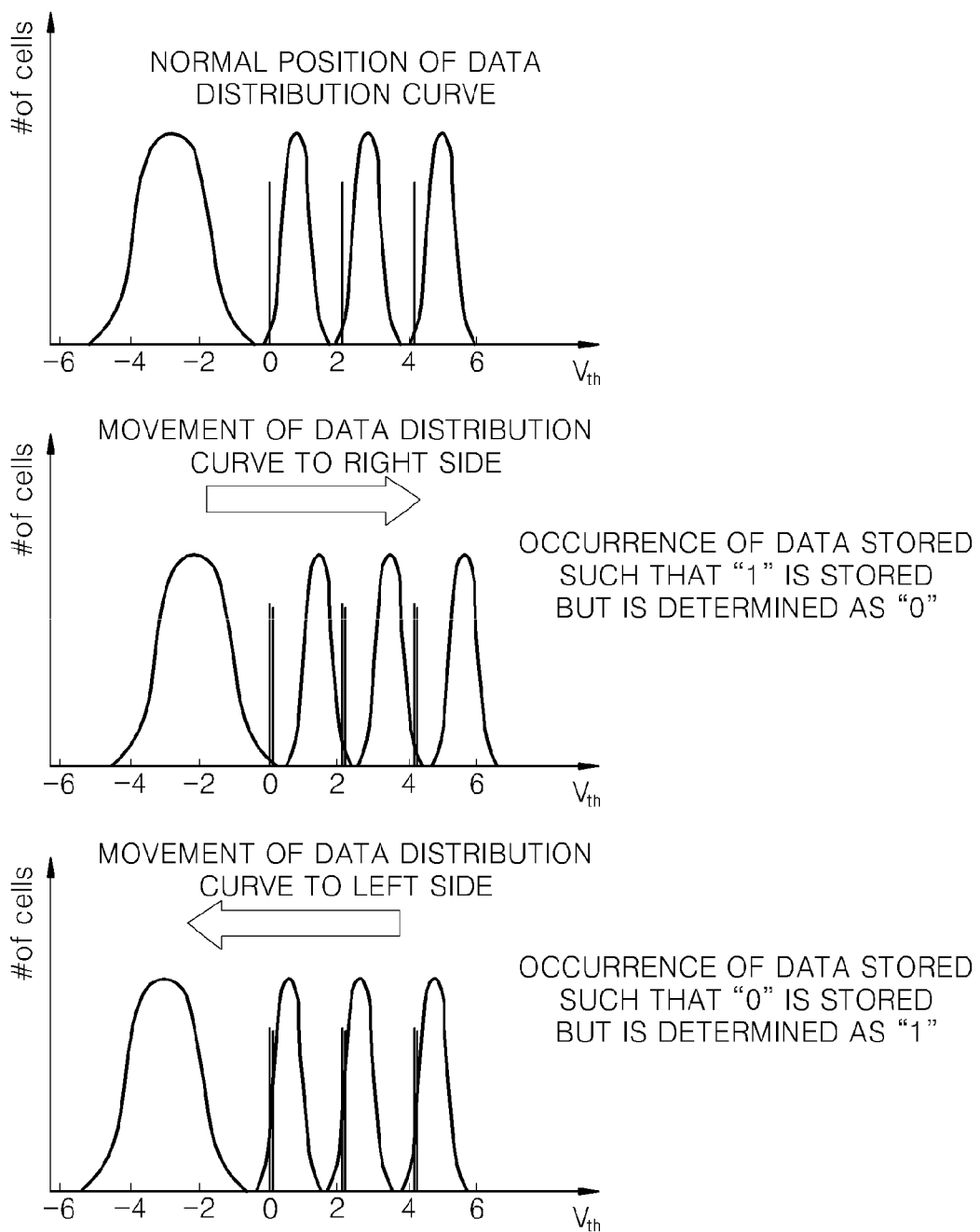
FIG. 16 is a diagram illustrating statistic characteristics of a data voltage distribution curve in which a data voltage distribution curve is taken along a movement direction according to a fourth embodiment of the present disclosure.

FIG. 14 is a functional block diagram illustrating a concatenated BCH decoding circuit for a flash memory device according to a third embodiment of the present disclosure, and proposes a structure capable of expanding physical dimension forming the code as shown in FIG. 15 and FIG. 16 from 2-dimension to 3-dimension.

The concatenated BCH decoding circuit shown in FIG. 14 includes a first stage decoding unit that receives a part of a concatenated BCH code, performs BCH decoding, and outputs a first output BCH code or first output data protected thereby, a first interleaving unit that divides the first output BCH code or the first output data of the first stage decoding unit into two or more blocks, interleaves, and converts the blocks from an X-axis code to a Y-axis code (or from a column code to a row code), a second stage decoding unit that receives the output of the first interleaving unit, performs BCH decoding, and outputs a second output BCH code or second output data protected thereby, a second interleaving unit that divides the second output BCH code or the second output data of the second stage decoding unit into two or more blocks, interleaves, and converts the blocks from a Y-axis code to a Z-axis code (or from a row code to a diagonal code), a third stage decoding unit that receives the output of the second interleaving unit, performs BCH decoding, and outputs a third output BCH code or third output data protected thereby, and a third interleaving unit that divides the third output BCH code or the third output data of the third stage decoding unit into two or more blocks, interleaves, and converts the blocks from a z-axis code to an X-axis code (or from a diagonal code to a column code).

Herein, the first to third stage decoding units are configured by a plurality of decoders capable of block-wise decoding codes having directivity different from each other, and the first to third interleaving units are embodied by block-wise interleavers capable of converting directivity of the codes.

Subsequently, referring to FIG. 14, the operation of the concatenated BCH decoding circuit will be described. However, for convenience of description, in FIG. 14, a case of decoding the concatenated BCH code having the structure of FIG. 15 will be restrictedly described.

First, n-bit storage data of read in the memory cell of the flash memory device is divided into $k_{Dim1}^B$ x-axis codes, and the codes are applied to the plurality of decoders of the first stage decoding unit.

They are divided into $k_{Dim1}^B$ x-axis codes, pass through the plurality of decoders of the first stage decoding unit, are subjected to BCH decoding, and are output as $k_{Dim1}^B$ x-axis messages. The messages are converted into $k_{Dim2}^B$ y-axis message or y-axis code through the block-wise first interleaving unit and are output.

When the plurality of decoders of the first stage decoding unit succeed in decoding with respect to all the $k_{Dim2}^B$ x-axis codes, the y-axis message or the y-axis message that is a part of the y-axis code is immediately output. Otherwise, to perform the y-axis decoding operation, the $k_{Dim2}^B$ y-axis messages or y-axis codes are applied to the plurality of decoders of the second stage decoding unit, are subjected to BCH decoding, and are output as $k_{Dim2}^B$ y-axis messages or $k_{Dim2}^B$ y-axis codes including the y-axis messages. The $k_{Dim2}^B$ y-axis messages or y-axis codes are converted into $k_{Dim3}^B$ z-axis messages or z-axis codes through the block-wise second interleaving unit, and are output.

In addition, when the plurality of decoders of the second stage decoding unit succeed in decoding with respect to all the $k_{Dim3}^B$ z-axis codes, the z-axis message or the z-axis message that is a part of the z-axis code is immediately output as data. Otherwise, to perform the z-axis decoding operation, the $k_{Dim3}^B$ z-axis messages or z-axis codes are applied to the plurality of decoders of the third stage decoding unit again.

Then, the plurality of decoders of the third stage decoding unit performs BCH decoding of the $k_{Dim3}^B$ z-axis message or z-axis codes, and then outputs $k_{Dim3}^B$ z-axis message or $k_{Dim3}^B$ z-axis codes including the z-axis messages.

When the repetition end is declared or the plurality of decoders of the third stage decoding unit succeed in decoding with respect to all the $k_{Dim3}^B$ z-axis message or z-axis codes, the z-axis messages or z-axis codes are immediately output as data. Otherwise, to perform the x-axis decoding operation again, they are applied to the block-wise third interleaver, $k_{Dim1}^B$ x-axis codes are output, and they are applied to the plurality of decoders of the first stage again.

As described above, the concatenated BCH decoding circuit shown in FIG. 14 is provided with three stage decoding units corresponding to the codes having directivities different from each other, and three interleaving units for converting directivities of the codes, and the decoding operation is performed even on all the codes expanded to 3-dimension. In such a case, the concatenated BCH decoding is subjected to error protection through a greater number of constituent codes, and thus there is an advantage that it is possible to obtain a low error rate even in a channel of a relatively low signal-to-noise ratio (SNR).

In addition, in the present disclosure, the 3-dimensional codes have been restrictedly described, but it is obvious that the number of stage decoding units and the interleaving units is expanded, and code directivities are defined corresponding thereto, and thus it is possible to variously expand dimensions of decodable codes.

FIG. 15 is a functional block diagram illustrating a concatenated BCH multi-stage decoding circuit capable of re-defining a threshold voltage of a flash memory device according to a fourth embodiment of the present disclosure.

Referentially, in the concatenated BCH code of the present disclosure, one entire concatenated BCH (70528, 65536) code may be formed of 16 row codes and column codes in which a length of a message part is 4096. Accordingly, when even one code of total 32 codes fails in decoding, it is determined that the entire concatenated BCH code cannot correct the error. However, when distribution of errors in one page occurs independently from a NAND floating gate, statistic characteristics of a data distribution curve are obtained after decoding of the other BCH code with a short length succeeding in decoding, and it is possible to retry the error correction of the other code failing in decoding. In this case, the statistic characteristic may be the number of cases where "1" is stored but is stored to be determined as "0", cases where "0" is stored but is stored to be determined as "1", or cases where "0" and "1" are stored and the storage value is as it is. As the cause of occurrence of error independent from a cell position, there are an aging effect of a floating gate and a retention error occurring by writing data and then escaping of charges after the lapse of time. And, a phenomenon of moving the data voltage distribution curve to the right side or the left side by the errors occurs. That is, as shown in FIG. 16, statistic characteristics are obtained in which when the data voltage distribution curve is moved to the right side, data stored such that "1" is stored but is stored to be determined as "0" mainly occurs, and when the data voltage distribution curve is moved to the left side, data stored such that 0" is stored but is stored to be determined as "1" mainly occurs.

Accordingly, in the present disclosure, a new threshold voltage capable of covering a data voltage distribution movement direction on the basis of the statistic characteristics is estimated, the data failing in decoding is read again using it, the raw-bit error rate is lowered, a signal to noise ratio (SNR) is raised, and thus finally, and an effect of lowering a page error rate is provided.

Accordingly, the concatenated BCH multi-stage decoding circuit shown in FIG. 15 includes a first stage decoding unit that receives a part of a concatenated BCH code, performs BCH decoding, and outputs a first output BCH code or first output data protected thereby, a de-interleaving unit that divides the first output BCH code or the first output data into two or more blocks, de-interleaves, and outputs the blocks, a second stage decoding unit that performs BCH decoding of the output of the de-interleaving unit, and outputs a second output BCH code or second output data protected thereby, an interleaving unit that divides the second output BCH code or the second output data into two or more blocks, interleaves, and outputs the blocks to the first stage decoding unit, and a threshold voltage control unit that receives decoding success data from the first and second stage decoding unit, compares the data with the data read from the memory block-wise, calculates statistic characteristics of a data distribution curve, adjusts a threshold voltage of the flash memory device according to the statistic characteristics of the data distribution curve, and controls the flash memory device to re-input the data to the first stage decoding unit.

Figure 17:
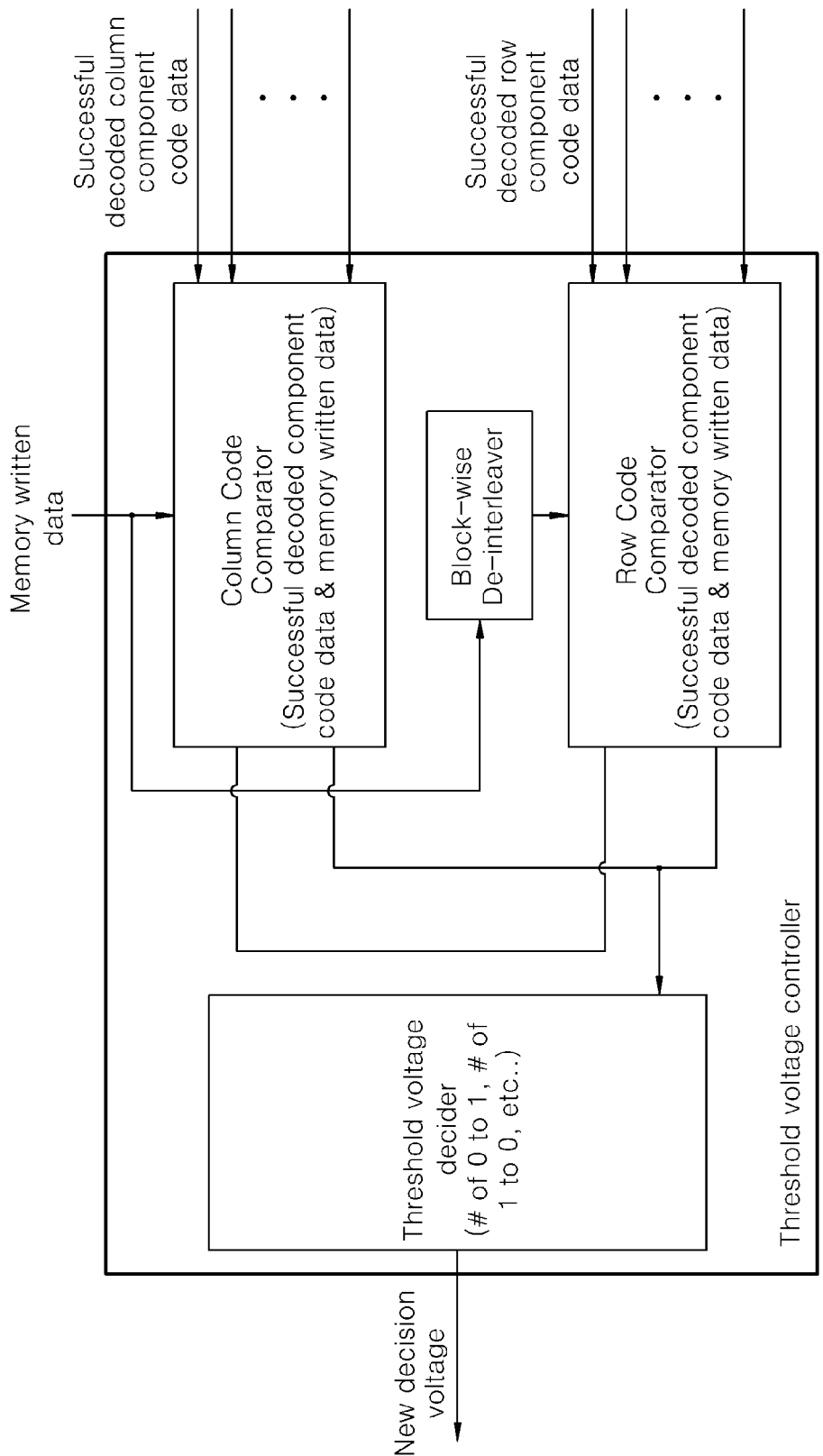
FIG. 17 is a diagram illustrating a detailed configuration of a threshold voltage control unit according to a fourth embodiment of the present disclosure.

Referring to FIG. 17, the threshold voltage control unit includes a first comparison unit that extracts only data corresponding to the decoding success data of the data read from the memory when a column direction decoding success data is transmitted from the first stage decoding unit, and compares the data block-wise to acquire statistic characteristics of the data distribution curve, a de-interleaving unit that de-interleaves the data read from the memory, and changes the column sequence of the data read from the memory to the row sequence thereof, a second comparison unit that extracts only data corresponding to the decoding success data of the output data of the de-interleaving unit when the row direction decoding success data is transmitted from the second stage decoding unit, and compares the data block-wise to acquire statistic characteristics of a data distribution curve, and a threshold voltage determining unit that is provided with a mapping table in which a threshold voltage adjustment standard corresponding to each of the statistic characteristics of the data distribution curve is stored, newly acquires a threshold voltage corresponding to the statistic characteristics of the data distribution curve acquired by the first and second comparison units on the basis of the mapping table, and reports the threshold voltage to the flash memory device.

In this case, the first comparison unit is a column decoding comparator, the de-interleaving unit is a block-wise de-interleaver, and the second comparison unit is a row decoding comparator.

Figure 18:
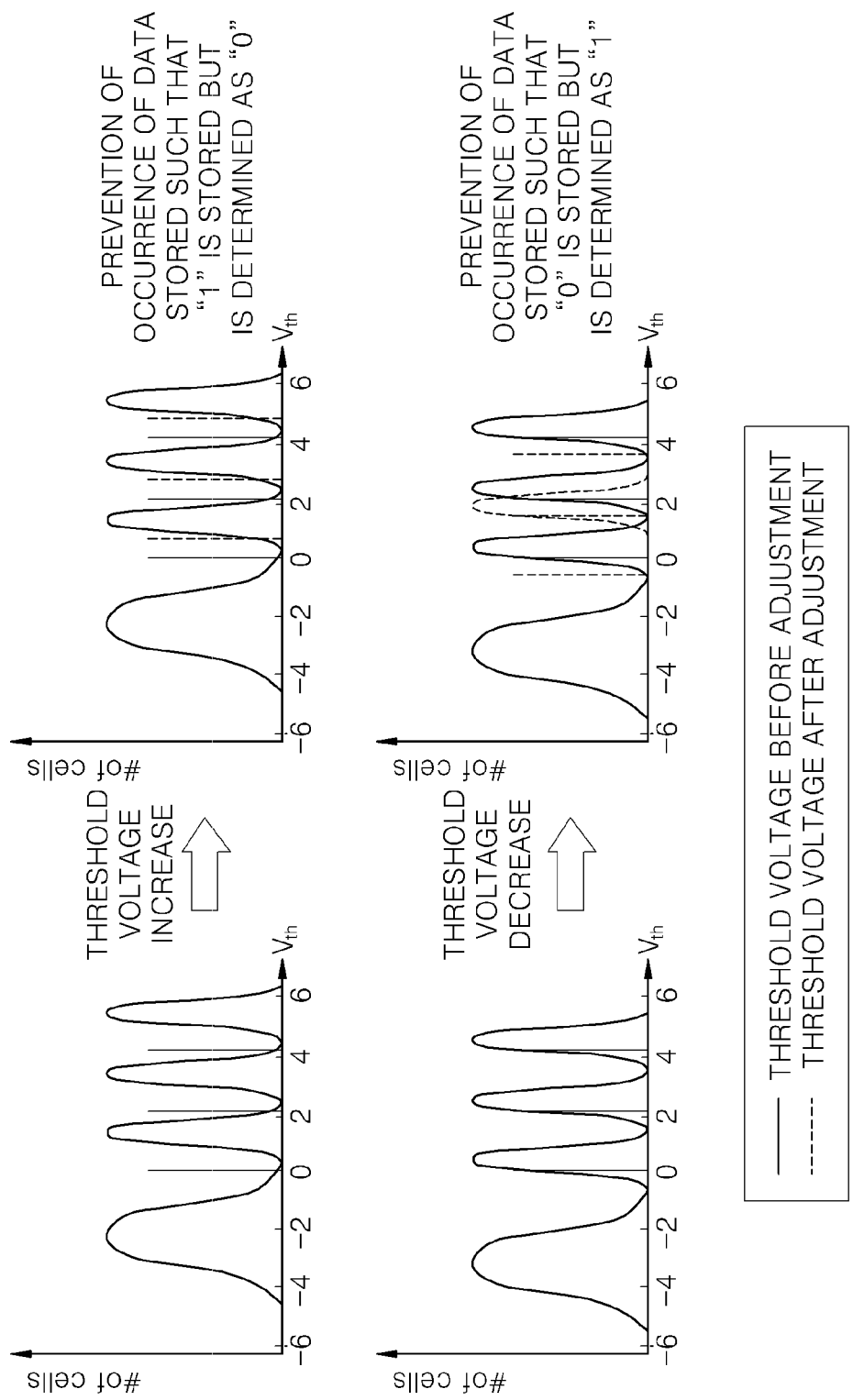
FIG. 18 is a diagram illustrating another threshold voltage movement example in a data voltage distribution curve according to a fourth embodiment of the present disclosure.

That is, the threshold voltage control unit of the present disclosure acquires and analyzes the number of cases where "1" is stored but is stored to be determined as "0" and the number of cases where "0" is stored but is stored to be determined as "1" through the first and second comparison units to grasp the change direction of the data distribution curve, and reports a new threshold voltage value to the flash memory device on the basis thereof. For example, as shown in FIG. 18, when the data determined such that "1" is stored but is stored to be determined as "0" occurs, it is determined that the data voltage distribution curve is moved to the right side, the threshold voltage is increased, and a variable degree is caused to be proportional to the number of data stored such that "1" is stored but is stored to be determined as "0". In addition, when the data determined such that "0" is stored but is stored to be determined as "1" occurs, it is determined that the data voltage distribution curve is moved to the left side, the threshold voltage is decreased, and a variable degree is caused to be proportional to the number of data stored such that "0" is stored but is stored to be determined as "1".

The flash memory device reads the data stored in itself with the threshold voltage adjusted by the threshold voltage control unit, and re-inputs the data to the concatenated BCH multi-stage decoding circuit. Such an operation may be performed once, and may be repeatedly performed many times as necessary. That is, it is possible to select the threshold voltage having the minimum page error rate while slightly adjusting the threshold voltage.

As described above, the threshold voltage control unit of the present disclosure performs the error correction operation in the concatenated BCH multi-stage decoding circuit, and selectively receives reliable data from the input end of the concatenated BCH multi-stage decoding circuit, and thus maximizes the error correction performance of the concatenated multi-stage decoding circuit.

FIG. 19 is a functional block diagram illustrating a concatenated BCH decoding circuit for a flash memory according to a fifth embodiment of the present disclosure, and proposes a structure for additionally providing a power reducing effect.

The concatenated BCH decoding circuit shown in FIG. 19 includes a first stage decoding unit that receives a part of concatenated BCH codes, performs BCH decoding, and outputs a first output BCH code or first output data protected thereby, a de-interleaving unit that divides the first output BCH code or the first output data into two or more blocks, de-interleaves, and outputs the blocks, a second stage decoding unit that performs BCH decoding of the output of the de-interleaving unit, and outputs a second output BCH code or second output data protected thereby, an interleaving unit that divides the second output BCH code or the second output data into two or more blocks, interleaves, and outputs the blocks to the first stage decoding unit, and a decoder power control unit that monitors operation states of the first and second stage decoding units to grasp a decoding success block, and temporarily shuts out power supply until a new concatenated BCH code is received with respect to the decoding success block.

In the concatenated BCH codes of the present disclosure, according to a multi-stage decoding method based on hard decision information, the decoding is ended when all errors of one page are corrected or there is no error to be corrected even when the repetition decoding is progressed, while repeating the decoding of the row code and the column code. In a case of constituent codes succeeding in decoding at the previous stage in the course of such a repetition decoding, it is not necessary to use the decoder again until the decoding is completed for the code word of the entire page.

Accordingly, when the power of the decoder succeeding in decoding at the previous stage is led to before the codes of the next page come in, it plays a great role of reducing power necessary in the decoding process. The average number of constituent codes succeeding in decoding for each repetition code, and probability of occurrence of an event to be progressed up to the number of repetition times are as shown in Table 2.

TABLE 2

| Iteration | Column Dec. | | Row Dec. | |
| --- | --- | --- | --- | --- |
| | $R^i_c$ | Avg. | $R^i_r$ | Avg. |
| 1 | 1 | 16 | 0.880 | 16 |
| 2 | 5.28E−2 | 4.58 | 4.91E−3 | 1.22 |
| 3 | 1.23E−6 | 4.11 | 6.39E−8 | 4.94 |
| 4 | 1.54E−9 | 5.5 | 7.70E−10 | 1 |

In the present disclosure, the decoder power control unit that temporarily shuts out the power of the decoder succeeding in decoding at the previous stage until the codes of the next page come in is proposed.

The decoder power control unit receives decoding failure information from the first and second stage decoding units, and grasps the decoding failure block or the decoding success block on the basis thereof. That is, decoding success column/row decoders of a plurality of column/row decoders are grasped from the decoding failure information provided by the first and second stage decoding units. The power supply to the decoding success column/row decoders of the plurality of column/row decoders is temporarily blocked.

Then, the decoders succeeding in decoding at the previous stage are excluded from the repetition decoding operation, thus the average number of used decoders for the multi-stage decoding operation is decreased, and the entire power consumption of the concatenated BCH decoding circuit is decreased.

However, when the repetition decoding operation is ended and a new code is input, the decoder power control unit is reset in response to that, and supplies the power to all the row/column decoders again to restart the repetition decoding operation for the new concatenated BCH code again.

The error correction circuit of the flash memory device according to the present disclosure includes an outer encoding unit that divides input data two or more piece of data, performs BCH encoding, and outputs row BCH codes of the same number as that of the divided data, an interleaving unit that divides a row BCH code or data protected thereby into two or more blocks again, interleaves the blocks, and outputs the same number of blocks, an inner encoding unit that performs BCH encoding of the blocks interleaved by the interleaving unit, and outputs a column BCH code, a first stage decoding unit that receives a part of storage data provided from a flash memory core, performs BCH decoding, and outputs a first output BCH code or first output data protected thereby, a de-interleaving unit that divides the first output BCH code or the first output data into two or more blocks, de-interleaves, and outputs the blocks, a second stage decoding unit that performs BCH decoding of the output of the de-interleaving unit, and outputs a second output BCH code or second output data protected thereby, and an interleaving unit that divides the second output BCH code or the second output data into two or more blocks, interleaves, and outputs the blocks to the first stage decoding unit.

The flash memory device of the present disclosure may be basically applied to the NAND flash memory device, but may be applied to different kinds of memory devices such as a NOR flash memory.

The concatenated BCH encoding, decoding, and multi-stage decoding circuit, and method, error correction circuit of the flash memory device using the same of the present disclosure can solve the technical problem by adjusting the delay time according to an error degree through the encoding, decoding, and multi-stage decoding for the flash memory device.

The embodiments of the present disclosure described above are disclosed to solve the technical problem, a person skilled in the art can variously modify, change, add the embodiments within the spirit and scope of the present disclosure, and it should be considered that the modifications and changes belong to claims disclosed below.

What is claimed is:

1. A concatenated Bose-Chadhuri-Hocquenghem (BCH) encoding circuit, comprising:
 a first stage encoding unit that receives a part or all of data input to a flash memory core, performs BCH encoding, and outputs a first output BCH code or a parity bit thereof;
 an interleaving unit that (i) receives a part or all of data input to the flash memory core, interleaves the data, and outputs the data, or (ii) that interleaves and outputs the first output BCH code or data protected thereby; and
 a second stage encoding unit that performs BCH encoding of the BCH code or data that is the output of the interleaving unit, and outputs a second output BCH code or a parity bit thereof.

2. The concatenated BCH encoding circuit of claim 1, wherein the interleaving unit receives a part or all of data input to the flash memory core, interleaves the data, and outputs the data.

3. The concatenated BCH encoding circuit of claim 1, the interleaving unit interleaves and outputs the first output BCH code or data protected thereby.

4. A concatenated Bose-Chadhuri-Hocquenghem (BCH) decoding circuit, comprising:
 a first stage decoding unit that receives a part of a concatenated BCH code, performs BCH decoding, and outputs a first output BCH code or first output data protected thereby;
 a de-interleaving unit that divides the first output BCH code or the first output data into two or more blocks, de-interleaves and outputs the blocks;
 a second stage decoding unit that performs BCH decoding of the output of the de-interleaving unit, and outputs a second output BCH code or second output data protected thereby; and
 an interleaving unit that divides the second output BCH code or the second output data into two or more blocks, interleaves, and outputs the blocks to the first stage decoding unit.

5. The concatenated BCH decoding circuit according to claim 4, further comprising an additional decoding unit that receives decoding failure information from the first and second stage decoding units, receives the second output BCH code or the second output data protected thereby, and performs additional decoding on the decoding failure block.

6. The concatenated BCH decoding circuit according to claim 5, wherein, when decoding failure of the concatenated BCH code occurs in a small number of error blocks, the additional decoding unit obtains only additional information corresponding to the error blocks, performs additional decoding, and corrects an error.

7. The concatenated BCH decoding circuit according to claim 6, wherein the additional information includes information about bits corresponding to a small number of error blocks, positions of which are determined.

8. The concatenated BCH decoding circuit according to claim 6, wherein the additional decoding unit receives decoding failure or success of constituent codes from both of the first and second stage decoding units to perform the additional decoding, and determines the positions of the small number of error blocks.

9. The concatenated BCH decoding circuit of claim 4, further comprising:
 a decoder power control unit that monitors an operation state of the first and second stage decoding unit, grasps a decoding success block, and temporarily shuts out power supply until a new concatenated BCH code is input with respect to the decoding success block.

10. The concatenated BCH decoding circuit according to claim 9, wherein the decoder power control unit grasps a decoding success decoder using decoding failure information transmitted from each of the plurality of column decoder and the plurality of row decoder, and temporarily shuts out power supply to the decoding success decoder until a new concatenated BCH code is received.

11. A concatenated Bose-Chadhuri-Hocquenghem (BCH) decoding circuit, comprising:
 a stage decoding unit that receives a part of storage data provided from a flash memory core at a first stage start decoding time, receives a de-interleaving result at a second stage decoding time, and receives an interleaving result at a first stage re-decoding time, performs BCH decoding, and outputs an output BCH code and output data protected thereby;
 a de-interleaving unit that divides the output BCH code or the output data of the stage decoding unit at a first stage decoding completion time into two or more blocks, de-interleaves, and outputs the blocks to the stage decoding unit; and
 an interleaving unit that divides the output BCH code or the output data of the stage decoding unit at a second stage decoding completion time into two or more blocks, interleaves, and outputs the blocks to the stage decoding unit.

12. The concatenated BCH decoding circuit according to claim 11, wherein the row code and the column code haves the same message length, and are systematic codes in which a massage part and a parity part are completely divided.

13. A concatenated Bose-Chadhuri-Hocquenghem (BCH) decoding circuit, comprising:
 a plurality of stage decoding units that receive a part of storage data or an interleaving result provided from a flash memory core, and perform BCH decoding; and
 a plurality of interleaving units that are positioned between stage decoding units different from each other, interleave the decoding result of the stage decoding unit of the front stage for each block, convert data directivity thereof, and then provide the decoding result to the stage decoding unit of the rear stage.

14. The concatenated BCH decoding circuit according to claim 13, wherein the storage data provided from the flash memory core includes a plurality of codes having a 3-dimensional matrix structure, and x-axis parity information, y-axis parity information, and z-axis parity information assigned to an x-axis, a y-axis, and a z-axis of the plurality of codes, respectively.

15. The concatenated BCH decoding circuit according to claim 13, wherein the storage data provided from the flash memory core includes a plurality of codes having a 2-dimensional matrix structure, and a plurality of parity information assigned to the plurality of codes to have three or more kinds of directivity.

16. A concatenated Bose-Chadhuri-Hocquenghem (BCH) decoding circuit, comprising:
   a first stage decoding unit that receives a part of storage data provided from a flash memory core, and performs BCH decoding;
   a de-interleaving unit that divides the output of the first stage decoding unit into two or more blocks, de-interleaves, and outputs the blocks;
   a second stage decoding unit that performs BCH decoding of the output of the de-interleaving unit;
   an interleaving unit that divides the output of the second stage decoding unit into two or more blocks, interleaves, and outputs the blocks to the first stage decoding unit; and
   a threshold voltage control unit that receives decoding success data from the first and second stage decoding units, compares the data with the storage data, calculates statistic characteristics of a data distribution curve, adjusts a threshold voltage of the flash memory core according to the statistic characteristics of the data distribution curve, and controls the flash memory core to re-input the data to the first stage decoding unit.

17. The concatenated BCH decoding circuit according to claim 16, wherein the statistic characteristics are the number of cases where "1" is stored but is stored to be determined as "0", cases where "0" is stored but is stored to be determined as "1", or cases where "0" and "1" are stored and the storage value is as it is.

18. The concatenated BCH decoding circuit according to claim 17, wherein the threshold voltage control unit includes:
   a first comparison unit that compares decoding success data of the first stage decoding unit with the storage data for each block, and acquires statistic characteristics of a data distribution curve,
   a de-interleaving unit that de-interleaves the storage data,
   a second comparison unit that compares decoding success data of the second stage decoding unit with the output data of the de-interleaving unit for each block, and acquires statistic characteristics of a data distribution curve, and
   a threshold voltage determining unit that includes a mapping table in which a threshold voltage adjusting standard corresponding to each of the statistic characteristics of the data distribution curve is stored, newly acquires a threshold voltage corresponding to statistic characteristics of the data distribution curve grasped by the first and second comparison units on the basis of the mapping table, and reports the threshold voltage to the flash memory core.

19. An error correction circuit of a flash memory core, comprising:

an outer encoding unit that divides input data into two or more pieces of data, performs Bose-Chadhuri-Hocquenghem (BCH) encoding, and outputs row BCH codes of the same number as that of the divided data;
an interleaving unit that divides the row BCH code or data protected thereby into two or more blocks again, interleaves the blocks, and outputs the same number of blocks;
an inner encoding unit that performs BCH encoding of the blocks interleaved by the interleaving unit, and outputs column BCH codes;
a first stage decoding unit that receives a part of storage data provided from a flash memory core, performs BCH decoding, and outputs a first output BCH code or first output data protected thereby;
a de-interleaving unit that divides the first output BCH code or the first output data into two or more blocks, de-interleaves, and outputs the blocks; and
a second stage decoding unit that performs BCH decoding of the output of the de-interleaving unit, and outputs a second output BCH code or second output data protected thereby;
wherein the interleaving unit divides the second output BCH code or the second output data into two or more blocks, interleaves, and outputs the blocks to the first stage decoding unit.

20. The error correction circuit of claim 19, further comprising:
a decoder power control unit that monitors an operation state of the first and second stage decoding unit, grasps a decoding success block, and temporarily shuts out power supply until a new concatenated BCH code is input with respect to the decoding success block.

21. An error correction circuit of a flash memory core, comprising:
an outer encoding unit that divides input data into two or more piece of data, performs Bose-Chadhuri-Hocquenghem (BCH) encoding, outputs the same number of row BCH codes as that of the divided data;
an interleaving unit that divides the row BCH code or data protected thereby into two or more blocks again, interleaves the blocks, and outputs the same number of blocks;
an inner encoding unit that performs BCH encoding of the blocks interleaved by the interleaving unit, and outputs column BCH codes;
a stage decoding unit that receives a part of storage data provided from a flash memory core at a first stage start decoding time, receives a de-interleaving result at a second stage decoding time, and receives an interleaving result at a first stage re-decoding time, performs BCH decoding, and outputs an output BCH code and output data protected thereby; and
a de-interleaving unit that divides the output BCH code or the output data of the stage decoding unit at a first stage decoding completion time into two or more blocks, de-interleaves, and outputs the blocks to the stage decoding unit;
wherein the interleaving unit divides the output BCH code or the output data of the stage decoding unit at a second stage decoding completion time into two or more blocks, interleaves, and outputs the blocks to the stage decoding unit.

22. An error correction circuit of a flash memory core, comprising:
an outer encoding unit that divides input data into two or more pieces of data, performs Bose-Chadhuri-Hocquenghem (BCH) encoding, and outputs row BCH codes of the same number as that of the divided data;

an interleaving unit that divides the row BCH code or data protected thereby into two or more blocks again, interleaves the blocks, and outputs the same number of blocks;

an inner encoding unit that performs BCH encoding of the blocks interleaved by the interleaving unit, and outputs column BCH codes; and a plurality of stage decoding units that receive a part of storage data or an interleaving result provided from a flash memory core, and perform BCH decoding;

wherein the interleaving unit comprises a plurality of interleaving units that are positioned between stage decoding units different from each other, interleave the decoding result of the stage decoding unit of the front stage for each block, convert data directivity thereof, and then provide the decoding result to the stage decoding unit of the rear stage.

23. An error correction circuit of a flash memory core, comprising:

an outer encoding unit that divides input data into two or more piece of data, performs Bose-Chadhuri-Hocquenghem (BCH) encoding, and outputs the same number of row BCH codes as that of the divided data;

an interleaving unit that divides the row BCH code or data protected thereby into two or more blocks again, interleaves the blocks, and outputs the same number of blocks;

an inner encoding unit that performs BCH encoding of the blocks interleaved by the interleaving unit, and outputs column BCH codes;

a first stage decoding unit that receives a part of storage data provided from a flash memory core, and performs BCH decoding;

a de-interleaving unit that divides the output of the first stage decoding unit into two or more blocks, de-interleaves, and outputs the blocks;

a second stage decoding unit that performs BCH decoding of the output of the de-interleaving unit, wherein the interleaving unit divides the output of the second stage decoding unit into two or more blocks, interleaves, and outputs the blocks to the first stage decoding unit; and a threshold voltage control unit that receives decoding success data from the first and second stage decoding units, compares the data with the storage data, calculates statistic characteristics of a data distribution curve, adjusts a threshold voltage of the flash memory core according to the statistic characteristics of the data distribution curve, and controls the flash memory core to re-input the data to the first stage decoding unit.

* * * * *